United States Patent
Lal et al.

(10) Patent No.: US 11,898,844 B2
(45) Date of Patent: Feb. 13, 2024

(54) SHEAR WAVE METHODS, SYSTEMS, AND GYROSCOPE

(71) Applicant: CORNELL UNIVERSITY, Ithaca, NY (US)

(72) Inventors: Amit Lal, Ithaca, NY (US); Benyamin Davaji, Ithaca, NY (US); Visarute Pinrod, Ithaca, NY (US)

(73) Assignee: Cornell University, Ithaca, NY (US)

( * ) Notice: Subject to any disclaimer, the term of this patent is extended or adjusted under 35 U.S.C. 154(b) by 797 days.

(21) Appl. No.: 17/063,179

(22) Filed: Oct. 5, 2020

(65) Prior Publication Data

US 2021/0293541 A1 Sep. 23, 2021

Related U.S. Application Data

(60) Provisional application No. 62/909,912, filed on Oct. 3, 2019.

(51) Int. Cl.
*G01C 19/5698* (2012.01)
*H05K 1/03* (2006.01)
*H05K 1/02* (2006.01)

(52) U.S. Cl.
CPC ....... *G01C 19/5698* (2013.01); *H05K 1/0296* (2013.01); *H05K 1/0306* (2013.01);
(Continued)

(58) Field of Classification Search
CPC .............................................. G01C 19/5698
See application file for complete search history.

(56) References Cited

U.S. PATENT DOCUMENTS

| | | | | |
|---|---|---|---|---|
| 4,101,852 A | * | 7/1978 | Epstein | H01Q 3/46 333/186 |
| 6,516,665 B1 | | 2/2003 | Varadan et al. | |

(Continued)

FOREIGN PATENT DOCUMENTS

| | | | | |
|---|---|---|---|---|
| CN | 111669142 A | * | 9/2020 | B81B 7/02 |
| RU | 2387951 C | | 4/2010 | |

(Continued)

OTHER PUBLICATIONS

Qualtré, White Paper, Bulk Acoustic Wave: Technology for the Next Generation of MEMS Gyroscopes, WP0001—Jun. 30, 2015, pp. 1-18.
(Continued)

*Primary Examiner* — Clayton E. LaBalle
*Assistant Examiner* — Diana Hancock
(74) *Attorney, Agent, or Firm* — Barnes & Thornburg LLP

(57) ABSTRACT

A rotation sensor, including: (i) a substrate having a top surface and an interior bottom surface; (ii) an electrode module positioned on the top surface of the substrate and including a first set of electrodes configured to generate a bulk acoustic wave directly into the substrate, wherein at least a portion of the bulk acoustic wave is transduced into a shear wave upon reflection on the interior bottom surface of the substrate without use of a reflector, and a second set of electrodes configured to detect the shear wave; and (iii) a controller in communication with the first set and second set of electrodes and configured to determine, based on the detected shear wave, an effect of Coriolis force on the sensor.

20 Claims, 16 Drawing Sheets

(52) U.S. Cl.
CPC ............... *H05K 2201/0175* (2013.01); *H05K 2201/09227* (2013.01)

(56) References Cited

U.S. PATENT DOCUMENTS

| | | | |
|---|---|---|---|
| 7,543,496 | B2 | 6/2009 | Ayazi et al. |
| 7,895,892 | B2 * | 3/2011 | Aigner ............... G01C 19/5698 73/504.04 |
| 7,900,512 | B2 | 3/2011 | Kano et al. |
| 8,919,199 | B2 * | 12/2014 | Judy .................. G01C 19/5698 73/514.32 |
| 9,088,263 | B2 | 7/2015 | Yamanaka |
| 9,528,832 | B2 | 12/2016 | Lee et al. |
| 9,843,304 | B2 | 12/2017 | Ballandras et al. |
| 9,917,571 | B2 | 3/2018 | Ayazi et al. |
| 11,451,209 | B2 * | 9/2022 | Gong ....................... H01Q 3/22 |
| 2019/0120624 | A1 | 4/2019 | Piazza et al. |
| 2019/0173452 | A1 | 6/2019 | Block et al. |

FOREIGN PATENT DOCUMENTS

| | | |
|---|---|---|
| RU | 2389000 C | 5/2010 |
| RU | 2543706 C | 3/2015 |
| RU | 2582483 C | 4/2016 |
| WO | 2010098605 | 9/2010 |

OTHER PUBLICATIONS

U.S. Appl. No. 62/740,683, filed Oct. 3, 2018.
O'Grady, Jason, Inside the iPhone 4's vibrational gyroscope, Jun. 30, 2010; https://www.zdnet.com/article/inside-the-iphone-4s-vibrationalgyroscope/.
Wang, W. et al., Enhanced Sensitivity of Novel Surface Acoustic Wave Microelectromechanical System—Interdigital Transducer Gyroscope, Jpn. J. Appl. Phys., vol. 48 (2009), pp. 06FK09-06FK09-8.
Mahmoud, A., et al., Investigating the impact of resonant cavity design on surface acoustic wave gyroscope, Proc. IEEE Inertial 2018, pp. 1-4.
Oh, H., et al., Development of SAW based gyroscope with high shock and thermal stability, Sensors and Actuators A 165 (2011) pp. 8-15.
Mahmoud, A., et al., Acousto-optic gyroscope, Proc. IEEE MEMS 2018, pp. 241-244.
Auriault, J.L., Body wave propagation in rotating elastic media, Mechanics Research Communications (2004) 31, 1, pp. 21-27.
Abdelmejeed, M., et al., AlN GHz ultrasonic pulse diffraction based transmit-receive oscillator with 1 PPM stability, Proc. Transducers 2017, pp. 106-109.
Constantinou, P., et al., "A 3D printed electromagnetic nonlinear vibration energy harvester," Smart Mater. Struct., vol. 25, No. 9, p. 095053, Sep. 2016.
Ristic, V.M., Bulk Mode Generation in Surface Wave Devices, Proc. IEEE IUS 1972, pp. 424-428.
Fang, H., "Vibrations of a Rotating Piezoelectric Body and Applications in Gyroscopes," University of Nebraska, 2000.

* cited by examiner $v_{in}$
$= A Cos(\omega_{BWDG1} t)$
$+ A Cos(\omega_{BWDG2} t) +$
$A Cos(\omega_{SAW} t)$ $v_{out}$
$= A Cos(\omega_{BWDG1}^+ t)$
$+ A Cos(\omega_{BWDG2} t) +$
$A Cos(\omega_{SAW} t)$

SHEAR WAVE METHODS, SYSTEMS, AND GYROSCOPE

CROSS-REFERENCE TO RELATED APPLICATIONS

The present application claims priority to and the benefit of U.S. Provisional Patent Application Ser. No. 62/909,912, filed on Oct. 3, 2019 and entitled "High-Overtone Bulk Diffraction Wave Gyroscope," the entire contents of which are hereby incorporated by reference in their entirety.

FIELD OF THE DISCLOSURE

The present disclosure relates to a rotation sensor, and more particularly, to a microelectromechanical (MEM) rotation sensor.

BACKGROUND

Accurate motion and rotation detection are increasingly important aspects of numerous different areas of technology. Travel applications including self-directed vehicles, gaming applications, device or image stabilization implementations, and smartphone and other mobile device movement or fall detection are just a few examples of areas that require extremely accurate motion and rotation detection and tracking.

MEMS technology is often utilized for motion and rotation detection, which has allowed for microscale gyroscopes and accelerometers to be implemented at a smaller, and more affordable, scale. These MEMS inertial sensors are usually a released mass spring system or other vibrating mechanical structure that reacts to acceleration or rate of rotation. However, these structures are affected by external shock that can cause the mass or other vibrating element to vibrate, thereby negatively affecting the detection of rotation.

BRIEF SUMMARY OF THE DISCLOSURE

Accordingly, there is a continued need in the art for low-cost, highly-accurate rotation sensors that are not susceptible to external shock.

The present disclosure is directed to a rotation sensor. The rotation sensor includes a substrate having a top surface and an interior bottom surface. The sensor also includes an electrode module positioned on the top surface of the substrate, which includes a first electrode configured to generate a bulk acoustic wave directly into the substrate. At least a portion of the bulk acoustic wave is transduced into a shear wave upon reflection on the interior bottom surface of the substrate without use of a reflector. The electrode module also includes a second electrode configured to detect the shear wave. A controller in communication with the first and second electrodes determine, based on the detected shear wave, an effect of Coriolis force on the sensor.

The high-overtone bulk diffraction wave gyroscope provides numerous advantages over the prior art. For example, prior art gyroscopes require a large number of reflectors to achieve the functionality, and the high-Q, of the high-overtone bulk diffraction wave gyroscope described or otherwise envisioned herein. Similarly, the high-overtone bulk diffraction wave gyroscope described or otherwise envisioned herein does not require moving parts which enables solid-state operation and minimizes or eliminates the effect of external shock. The high-overtone bulk diffraction wave gyroscope can facilitate more than one gyroscope operation. For example, the system can be utilized for more than one shear wave diffraction, and can be used for other gyroscope modes such as a surface acoustic wave (SAW) mode, which can be used concurrently by exciting these modes. Indeed, the use of both SAW and one or more bulk mode gyroscope functionalities may enable cancelling of common mode noise for better sensor performance. The system can cancel common terms such as temperature and acceleration. The system can be integrated with CMOS to enable the full use of the capabilities at RF.

According to an aspect is a rotation sensor. The rotation sensor includes: (i) a substrate having a top surface and an interior bottom surface; (ii) an electrode module positioned on the top surface of the substrate and comprising a first set of electrodes configured to generate a bulk acoustic wave directly into the substrate, wherein at least a portion of the bulk acoustic wave is transduced into a shear wave upon reflection on the interior bottom surface of the substrate without use of a reflector; and a second set of electrodes configured to detect the shear wave; and (iii) a controller in communication with the first set and second set of electrodes and configured to determine, based on the detected shear wave, an effect of Coriolis force on the sensor.

According to an embodiment, the substrate is lithium niobate ($LiNbO_3$).

According to an embodiment, the first set of electrodes are interdigitated. According to an embodiment, the second set of electrodes are interdigitated.

According to an embodiment, the first set of electrodes are centrally positioned on the substrate.

According to an embodiment, a quality factor of the rotation sensor is at least Q=30,000. According to an embodiment, a quality factor of the rotation sensor is at least Q=55,000.

According to an embodiment, the shear wave is generated from a high order diffraction wave.

According to an embodiment, the first electrode set and/or second electrode set comprises gold and/or titanium.

According to an embodiment, the rotation sensor is configured such that a thickness resonance of the bulk acoustic wave is maintained by a stress-free surface at a bottom of the first set of electrodes, and the bulk acoustic wave is therefore trapped under the first set of electrodes.

According to an embodiment, the second set of electrodes is perpendicular to the first set of electrodes.

According to another aspect is a method for detecting rotation. The method includes: providing a rotation sensor comprising: (i) a substrate having a top surface and an interior bottom surface; and (ii) an electrode module positioned on the top surface of the substrate and comprising a first set of electrodes and a second set of electrodes; generating, by the first set of electrodes, a bulk acoustic wave directly into the substrate, wherein at least a portion of the bulk acoustic wave is transduced into a shear wave upon reflection on the interior bottom surface of the substrate without use of a reflector; detecting, by the second set of electrodes, the shear wave; and determining, based on the detected shear wave, an effect of Coriolis force on the sensor.

These and other aspects of the invention will be apparent from the embodiment(s) described hereinafter.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION

The present disclosure is directed to a high-overtone bulk diffraction wave gyroscope. The gyroscope operation modality utilizes Coriolis force on diffracted bulk ultrasonic waves. The operation using bulk waves eliminates the need for released spring and masses enabling operation in extreme shock and vibration, for applications such as during collisions of automobiles. The gyroscope uses interdigitated electrodes that excite thickness mode resonances in a substrate such as a lithium-niobate substrate. The diffraction of pressure and shear waves occurs due to electrode finite aperture. The shear waves undergo Coriolis force modified reflections, with the modified waves transduced at receiver interdigitated transducers.

Figure 1:
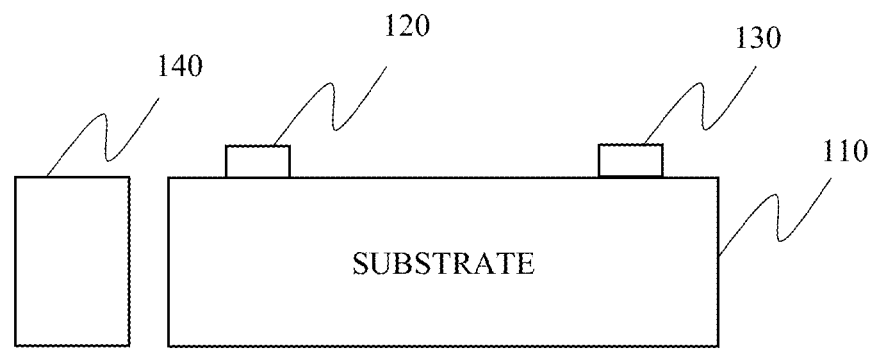
FIG. 1 is a schematic representation of a bulk diffraction wave gyroscope system, in accordance with an embodiment.

Referring to FIG. 1, in one embodiment, is a schematic representation of side view of a bulk diffraction wave gyroscope 100 as described or otherwise envisioned herein. In this embodiment, the gyroscope 100 comprises a substrate 110. According to an embodiment, the substrate can comprise lithium-niobate, although other substrates including but not limited to AlN and PZT, among other substrates, are possible. Gyroscope 100 also comprises a first electrode 120, which can be a drive electrode configured to generate a bulk acoustic wave directly into the substrate. According to an embodiment, the first electrode comprises gold, titanium, and/or another suitable metal. The first electrode may be an interdigitated electrode. Gyroscope 100 also comprises a second electrode 130, which can be a sense electrode configured to detect a shear wave resulting from the bulk acoustic wave reflecting from the interior bottom surface of the substrate. According to an embodiment, the second electrode comprises gold, titanium, and/or another suitable metal. The second electrode may be an interdigitated electrode.

According to an embodiment, the bulk diffraction wave gyroscope 100 comprises or is in wired or wireless communication with a controller 140. The controller may be formed of one or multiple modules. The controller 140 may take any suitable form, including but not limited to a microprocessor, microcontroller, multiple microcontrollers, circuitry, field programmable gate array (FPGA), application-specific integrated circuit (ASIC), a single processor, or plural processors. The controller may be programmed with software to perform one or more of the various functions discussed herein, and can be utilized in combination with a memory.

Figure 2:
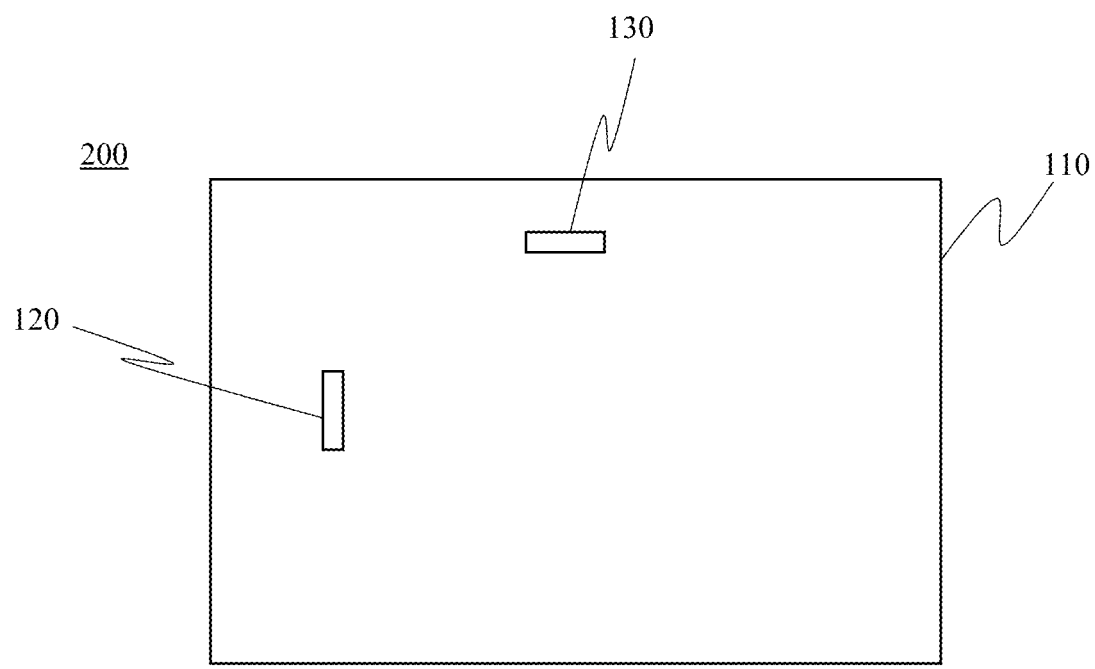
FIG. 2 is a schematic representation of a bulk diffraction wave gyroscope system, in accordance with an embodiment.

Referring to FIG. 2, in one embodiment, is a schematic representation of a top view of a bulk diffraction wave gyroscope 200 as described or otherwise envisioned herein. In this embodiment, the gyroscope 200 comprises a substrate 110, a first electrode 120, and a second electrode 130. According to an embodiment, the second electrode is positioned perpendicular to the first electrode.

Figure 3:
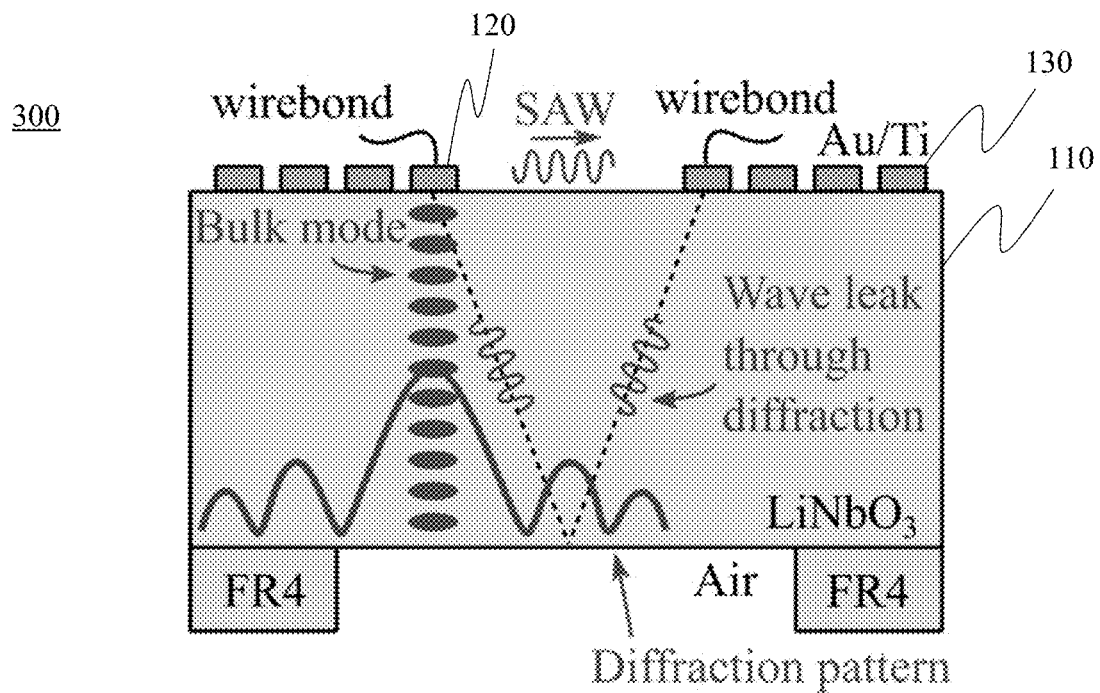
FIG. 3 is a schematic representation of a bulk diffraction wave gyroscope system, in accordance with an embodiment.

Referring to FIG. 3, in one embodiment, is a schematic representation of a side view of a bulk diffraction wave gyroscope 300 as described or otherwise envisioned herein. In this embodiment, the gyroscope 300 comprises a substrate 110, a first electrode 120 which is a drive electrode configured to generate a bulk acoustic wave directly into the substrate, and a second electrode 130 which is a sense electrode configured to detect a shear wave resulting from the bulk acoustic wave reflecting from the interior bottom surface of the substrate. In this embodiment, the gyroscope is positioned on a printed circuit board (PCB), such as FR4 although many other PCBs are possible. The gyroscope is positioned on the PCB such that there is a boundary of air or vacuum positioned under the bottom of the substrate, which enables reflection of the bulk acoustic wave off the interior bottom of the substrate.

Figure 4:
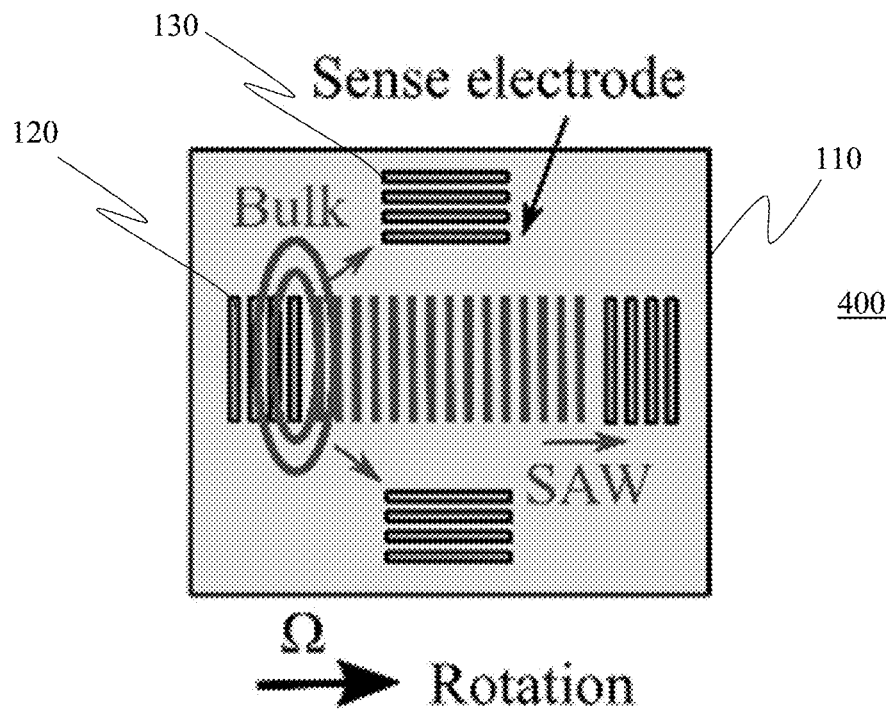
FIG. 4 is a schematic representation of a bulk diffraction wave gyroscope system, in accordance with an embodiment.

Referring to FIG. 4, in one embodiment, is a schematic representation of a top view of a bulk diffraction wave gyroscope 400 as described or otherwise envisioned herein. In this embodiment, the gyroscope 400 comprises a substrate 110, a drive electrode 120, and a sense electrode 130.

As shown in FIG. 4, the drive and/or sense electrode can comprise multiple electrodes, and the electrodes can be interdigitated, although other structures and arrangements are possible.

Figure 5:
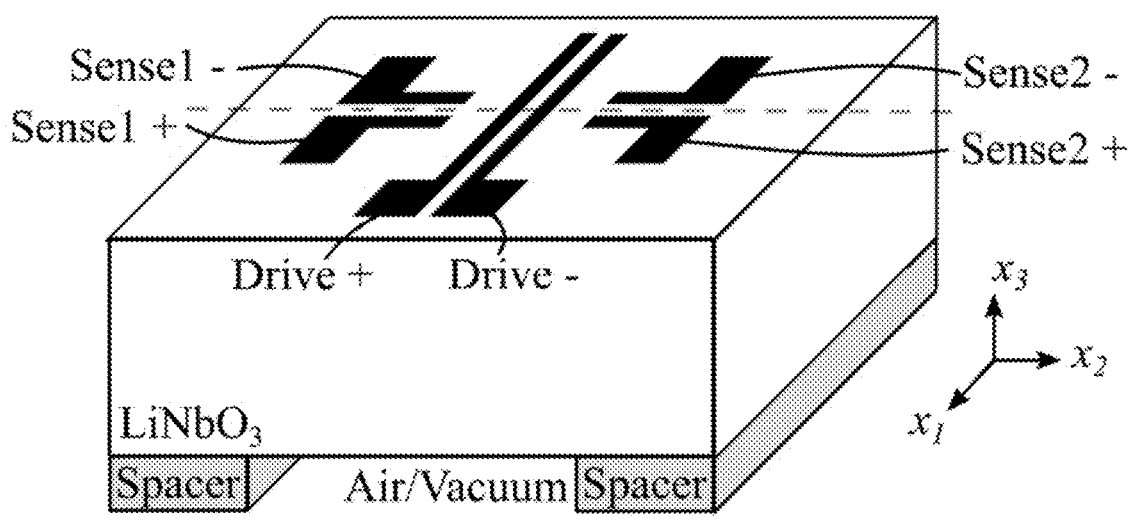
FIG. 5 is a schematic representation of a bulk diffraction wave gyroscope system, in accordance with an embodiment.
Figure 6:
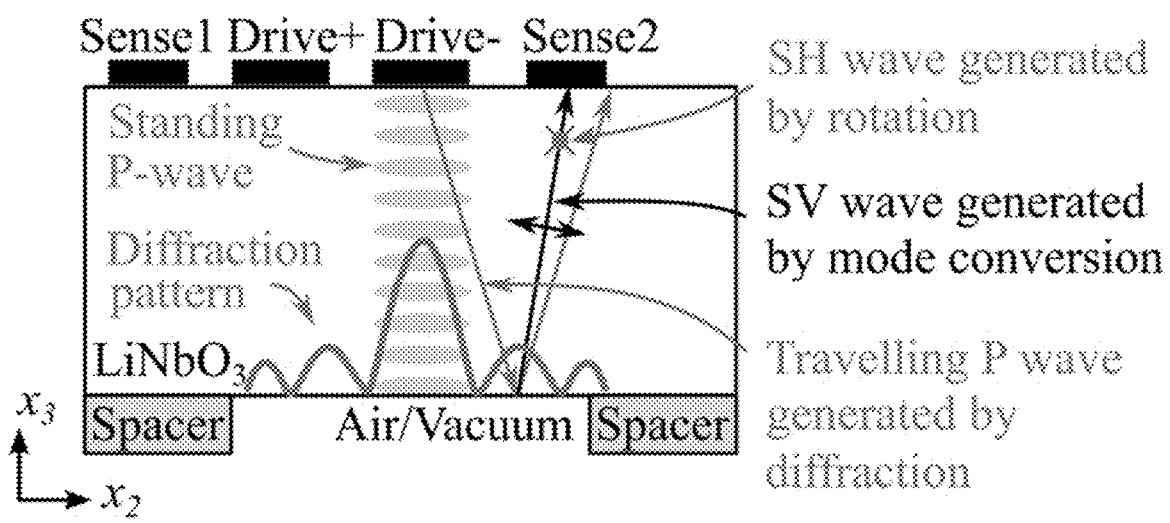
FIG. 6 is a schematic representation of a bulk diffraction wave gyroscope system, in accordance with an embodiment.

Referring to FIG. 5, in one embodiment, is a schematic representation of a top perspective view of a bulk diffraction wave gyroscope 500 as described or otherwise envisioned herein. In this embodiment, the gyroscope 500 comprises a substrate (LiNbO$_3$, although many other substrates are possible), one or more drive electrodes, and one or more sense electrodes. The gyroscope is positioned on a spacer and comprises a pocket of air or vacuum at the bottom surface of the substrate. Referring to FIG. 6, in one embodiment, is a schematic representation of a side view of a bulk diffraction wave gyroscope 600 as described or otherwise envisioned herein. FIG. 6 is shown from the viewpoint of the cross-section at the dashed line in FIG. 5. In this embodiment, the gyroscope 600 comprises a substrate (LiNbO$_3$, although many other substrates are possible), one or more drive electrodes, and one or more sense electrodes. The gyroscope is positioned on a spacer and comprises a pocket of air or vacuum at the bottom surface of the substrate.

According to the embodiments depicted in FIGS. 5 and 6, the gyroscope is fabricated on lithium niobate (LiNbO$_3$) substrates with a metal electrode geometry. The concept can be implemented in other materials such as AlN and PZT in both thin film and bulk substrate. This design takes an advantage of the drive standing wave to increase the gyroscope sensitivity. A high order longitudinal standing wave (P wave) is generated by a pair of drive electrodes, Drive + and Drive −. The P wave thickness resonance is maintained by a stress-free surface at the bottom and trapped under the electrodes. The drive electrode length dis designed to be comparable with the P wave wavelength $\pi_p$. The standing P wave generates a traveling P wave due to diffraction. The traveling P wave generates traveling shear vertical wave (SV wave) due to mode conversion from reflection at angle. This SV wave polarization rotate due to Coriolis force from external rotation as described herein. The rotated shear wave has polarization in $x_1$ direction and can be considered as a shear horizontal wave (SH wave). This SH wave can be measured with sense electrode pairs perpendicular to the drive electrode.

Figure 17:
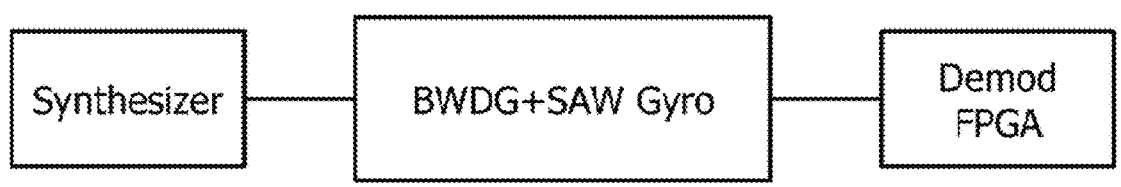
FIG. 17 is a schematic representation of a bulk diffraction wave gyroscope system, in accordance with an embodiment.
Figure 21:
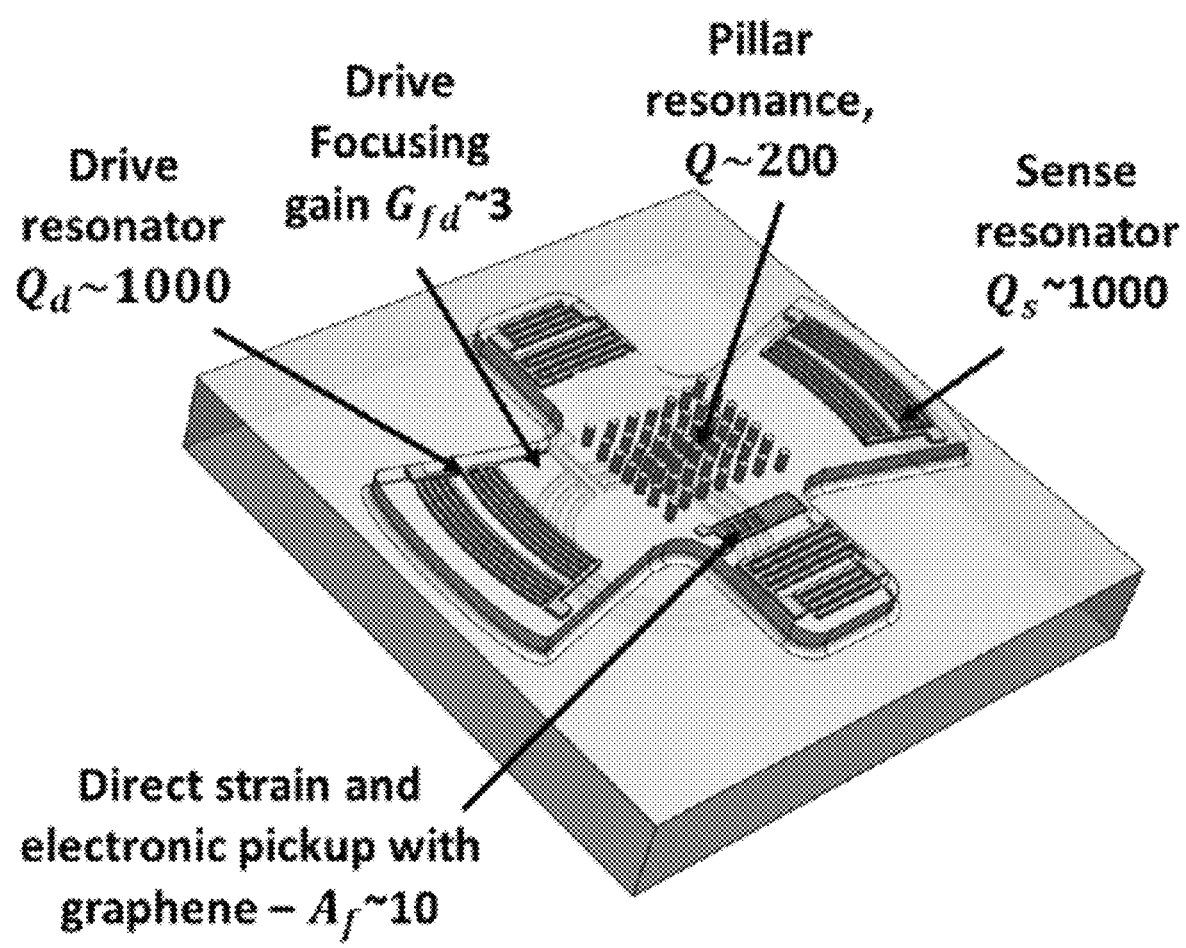
FIG. 21 is a schematic representation of a bulk diffraction wave gyroscope system, in accordance with an embodiment.
Figure 22:
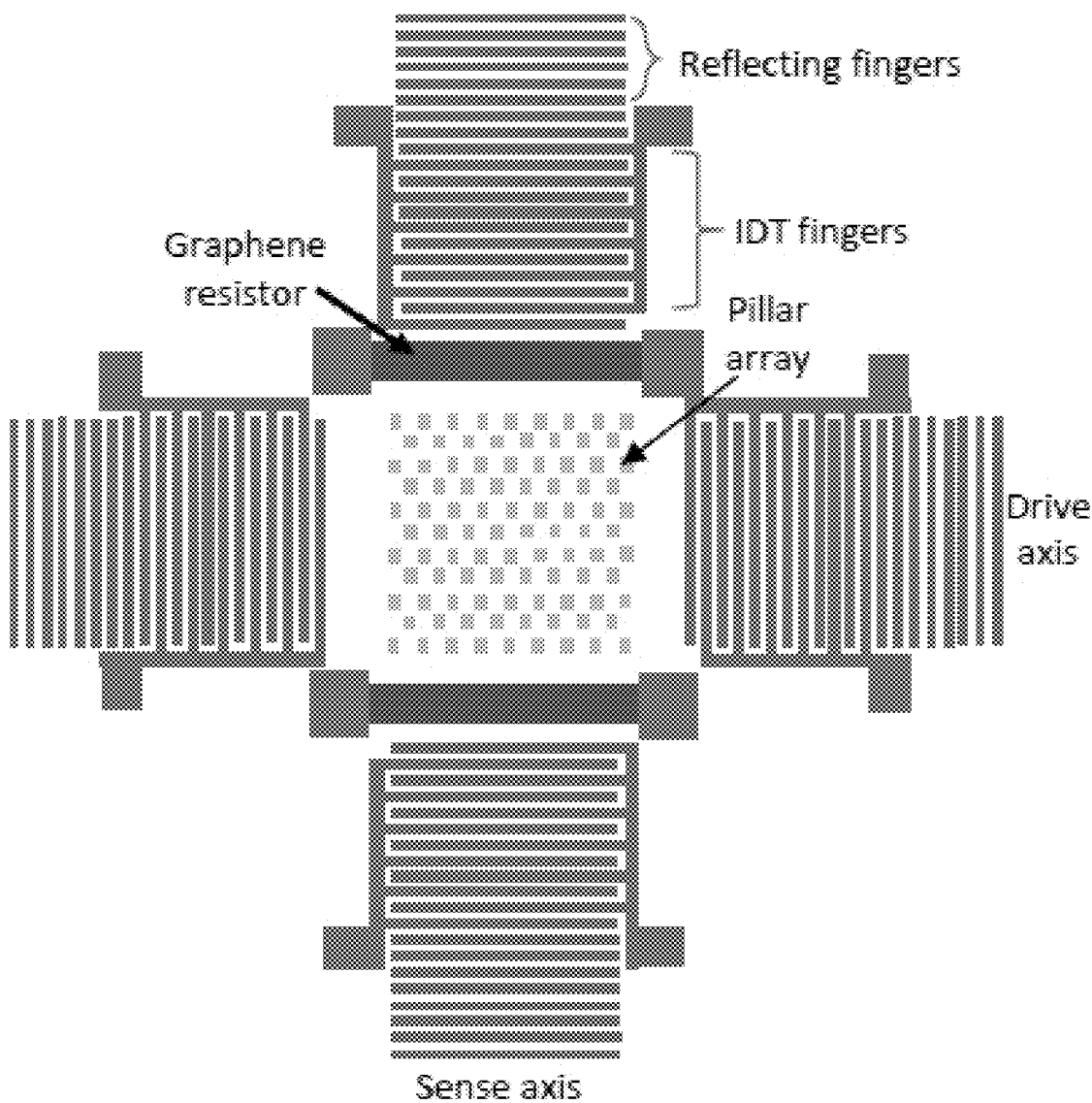
FIG. 22 is a schematic representation of a bulk diffraction wave gyroscope system, in accordance with an embodiment.
Figure 23:
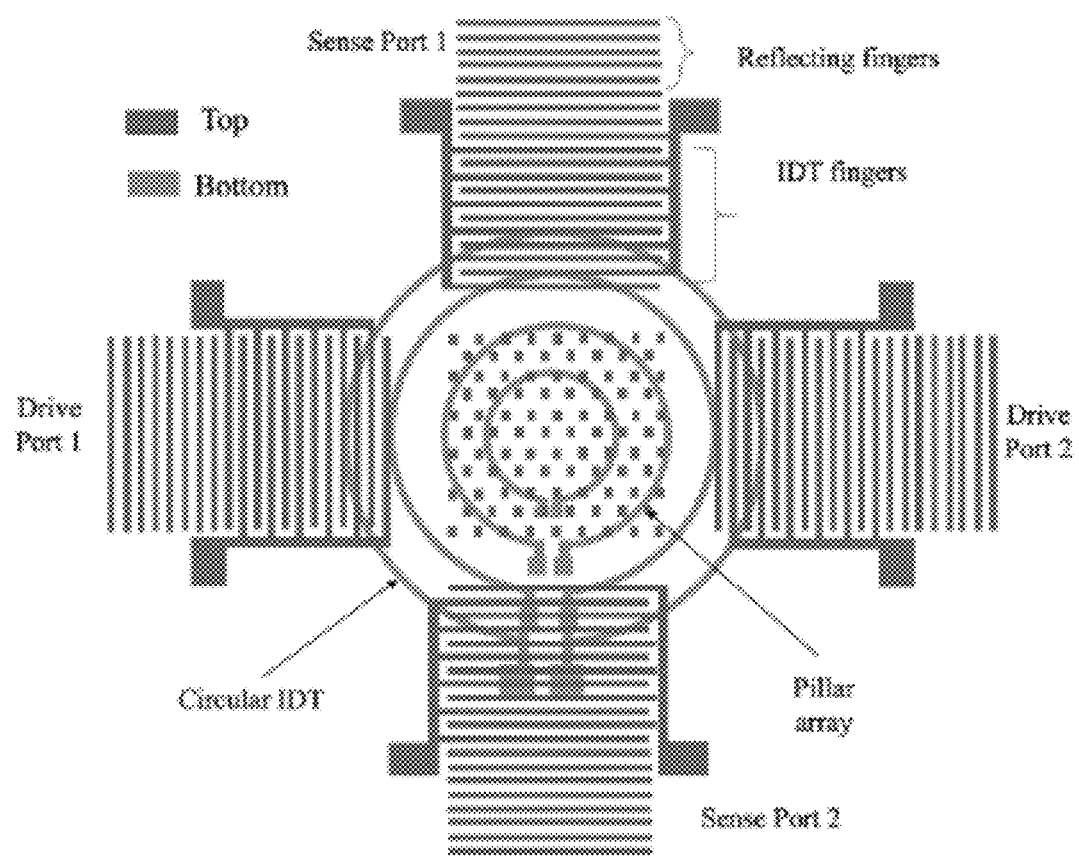
FIG. 23 is a schematic representation of a bulk diffraction wave gyroscope system, in accordance with an embodiment

Referring to FIG. 17, in one embodiment, is a schematic representation of a bulk diffraction wave gyroscope system as described or otherwise envisioned herein. In this embodiment, the gyroscope system comprises a signal synthesizer, the gyroscope sensor component, and a controller such as a FPGA which receives and analyzes the sensor signal from the gyroscope sensor component. Further, referring to FIGS. 21-23 are other possible embodiments of a bulk diffraction wave gyroscope system as described or otherwise envisioned herein.

Figure 18:
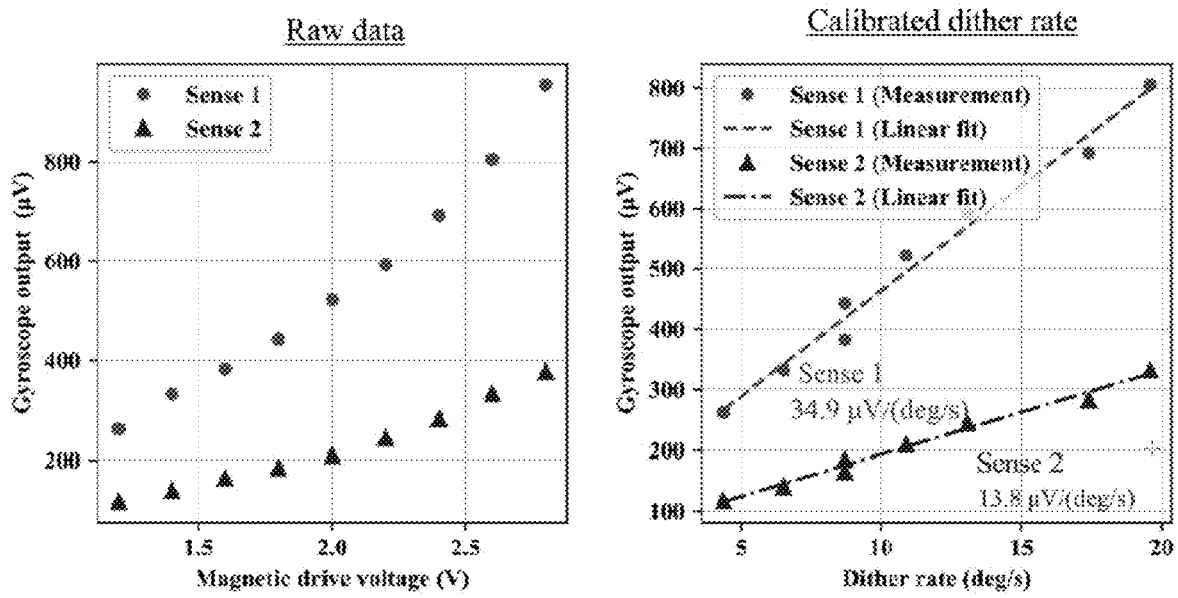
FIG. 18 is a graph of SAW gyroscope functionality, in accordance with an embodiment.
Figure 19:
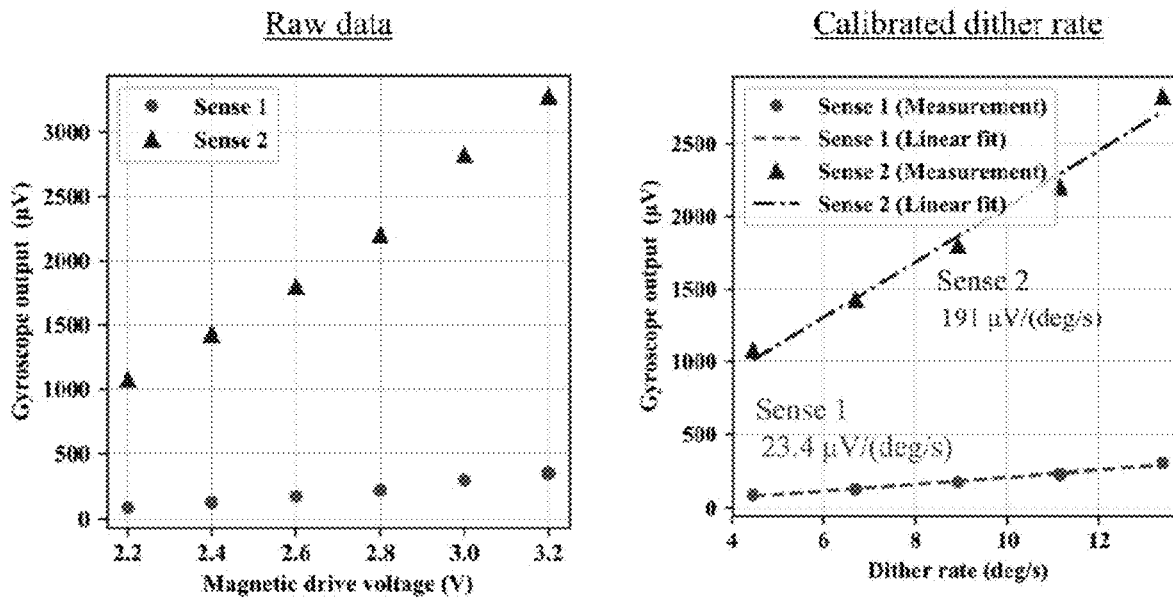
FIG. 19 is a graph of bulk diffraction wave gyroscope functionality, in accordance with an embodiment.

Referring to FIGS. 18 and 19 is a comparison of SAW and bulk gyroscope functionality, respectively. The results are summarized in TABLE 1.

TABLE 1

| Mode | Frequency (MHz) | Scale factor S1 (μV/(°/s)) | Scale factor S2 (μV/(°/s)) |
|---|---|---|---|
| SAW | 79.61783 | 34.9 | 13.8 |
| Thickness | 163.7644 | 23.4 | 191 |

Figure 20:
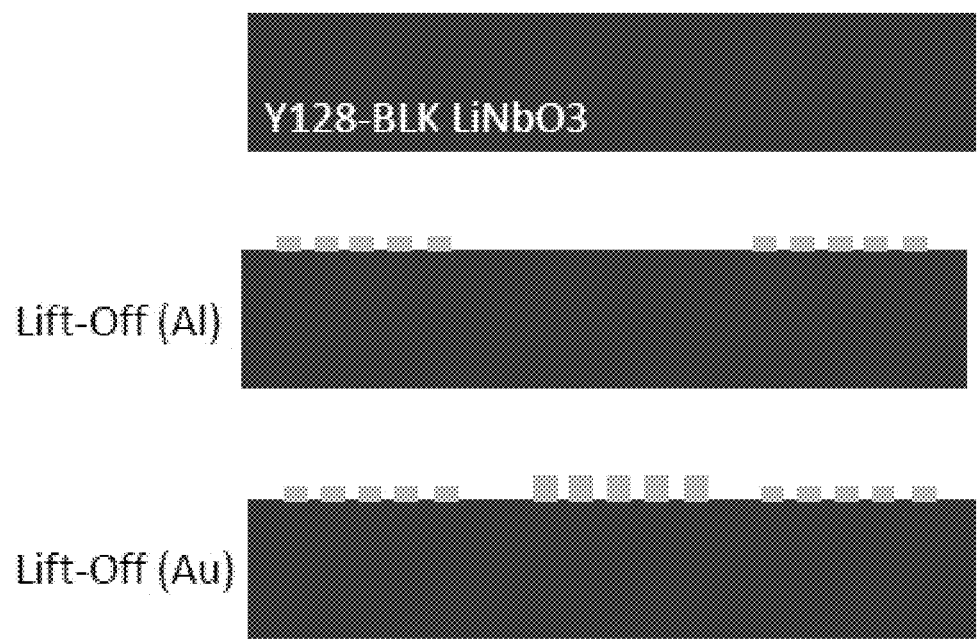
FIG. 20 is a schematic representation of bulk diffraction wave gyroscope construction, in accordance with an embodiment.

Referring to FIG. 20, in one embodiment, is a method for gyroscope manufacture. The device can be fabricated on a LiNbO$_3$ lithium niobate piezoelectric substrate. One can use specific ordination of the crystal for maximizing the electromechanical coupling. It can start with 4 inch wafers and pattern the electrodes and reflectors using the first lift off where Al is used. In the second lift off process are patterned the Coriolis mass arrays and can use Au due to higher density. So thus there may be a higher mass in the same dimension and a higher Coriolis force.

EXAMPLE

In this non-limiting example, a bulk diffraction wave gyroscope is described with regard to a particular embodiment. It should be understood that this example is just one possible embodiment of the bulk diffraction wave gyroscope, and does not limit the scope of the disclosure.

In this example, the gyroscope uses interdigitated electrodes that excite thickness mode resonances in a lithium-niobate substrate. The diffraction of pressure and shear waves occurs due to electrode finite aperture. The shear waves undergo Coriolis force modified reflections, with the modified waves transduced at receiver interdigitated transducers. The measured gyroscope scale factor, without an amplifier, was 191 μV/(deg/s), which is one of the largest scale factor reported for an all-solid state gyroscope (Table 2). Zero rate angle random walk (ARW) was 0.028 deg/hr$^{1/2}$, and bias fluctuation was 8 deg/hr at a power consumption of 5.3 mW, operating at overtone resonance frequency of 163 MHz.

TABLE 2

| Gyroscope | Freq. | ARW | SF | Pillar |
|---|---|---|---|---|
| Prior Art | 80 MHz | Not reported | 3.2 μV/Deg/S | Au (400 nm) |
| Prior Art | 115 MHz | 5.5°/√hr | 0.96 μV/Deg/S | Au (282 nm) |
| Present Gyroscope | 164 MHz | 0.028°/√hr | 191 μV/Deg/S | Au (400 nm) |

Figure 7A:
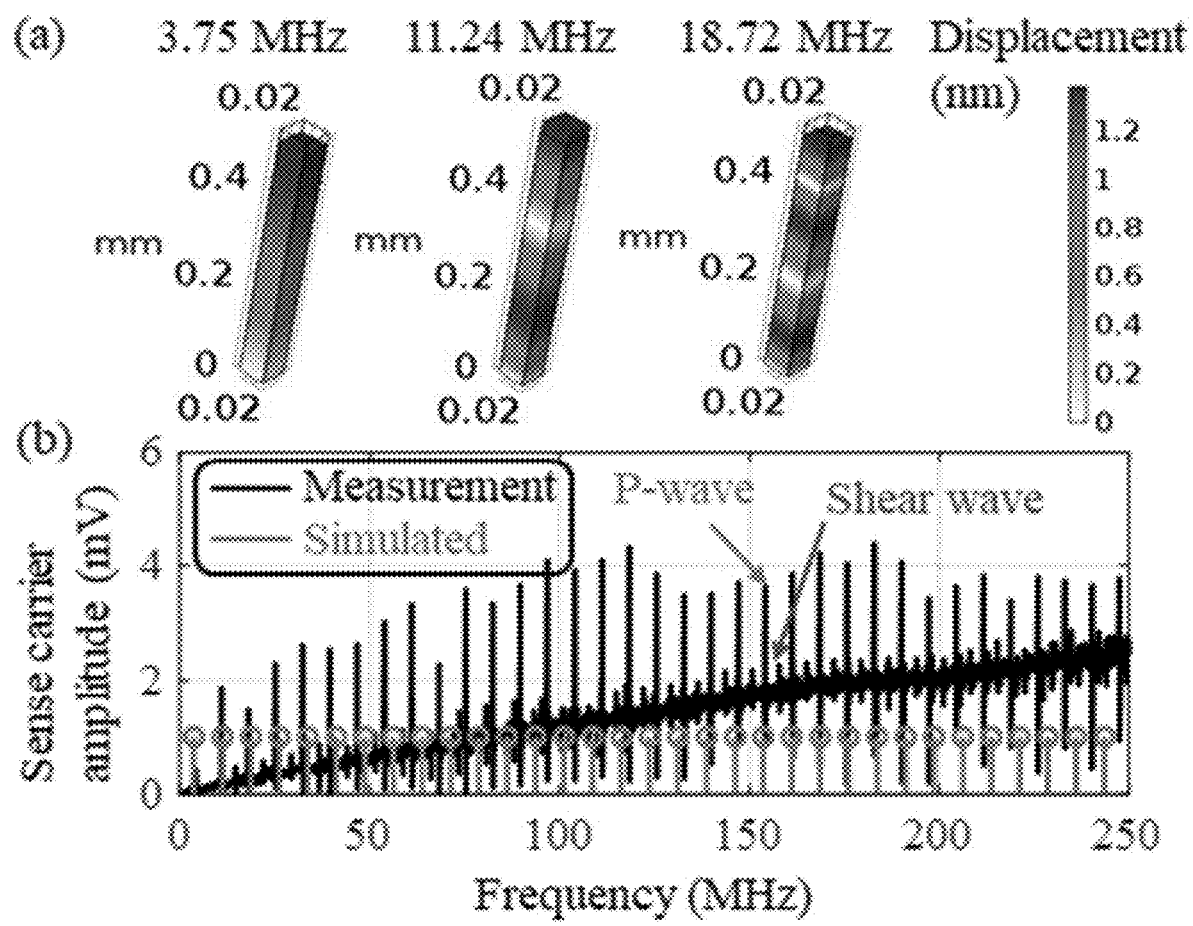
FIG. 7A is: (a) is a bulk mode shape from a COMSOL simulation; and (b) a sense port carrier amplitude showing modes with frequency agrees with the simulation, in accordance with an embodiment.
Figure 7B:
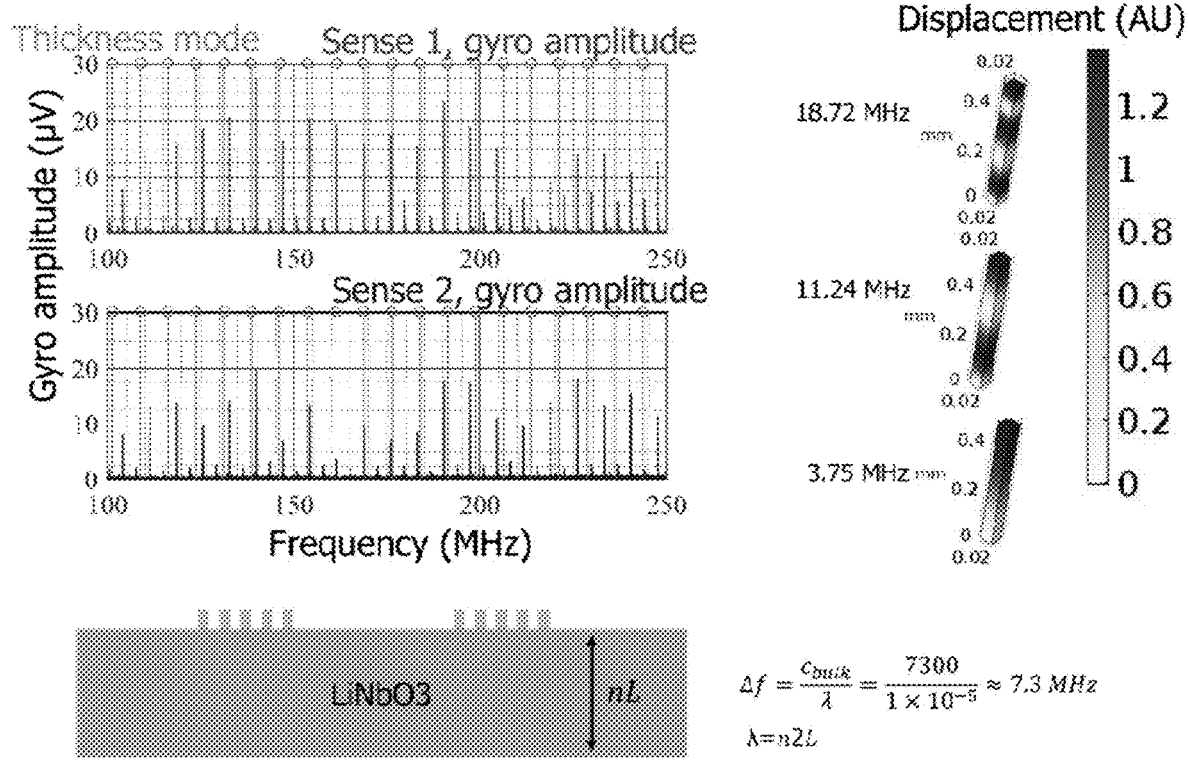
FIG. 7B is a graph of shear wave detection by the bulk diffraction wave gyroscope system, in accordance with an embodiment.

Prior art surface acoustic wave (SAW) gyroscopes use solidly attached mass arrays at velocity antinodes, to produce secondary SAWs proportional to the Coriolis force on the masses, and suffer from low sensitivity. Integrated photonic transduction on SAW gyroscope has been explored recently to increase sensitivity, although it does not achieve the necessary sensitivity rates. However, according to the present invention there is the described mechanism to use high-Q bulk resonances with leaky diffraction, in addition to the SAW modality, to increase the sensitivity. For pressure and shear bulk elastic waves in the rotating earth, it has been shown that rotation effects the shear wave reflection. Following from this insight, in the bulk-wave diffraction based gyroscope, shear waves generated from higher order diffraction waves from the prime resonance arrive at receive IDTs with different amplitude providing high Q and effective transduction. Using the structure shown in FIGS. 5 and 6, it was possible to excite bulk transmit-receive wave high-Q (~55000) resonances (see, e.g., FIG. 7A in which (a) is a bulk mode shape from a COMSOL simulation and (b) is a sense port carrier amplitude showing modes with frequency agrees with the simulation, and similarly see FIG. 7B), and measure high scale factor for the gyro at a frequency different than the SAW gyro frequency. Notably, SAW and the many bulk mode gyros can be operated at independent frequencies, to potentially reduce gyroscope temperature sensitivities.

According to one embodiment, the SAW/Bulk gyroscope can be fabricated by a 2-step lift off metal deposition process on Y128 black lithium-niobate substrate. The S11 shows two sets of resonances corresponding to resonances from the shear waves and pressure waves owing to the two different velocities. Measured bulk-mode resonance frequencies agree with the analytical analysis and numerical simulation of high-overtone bulk acoustic resonator (HBAR) (FIG. 7). The effective transducer aperture determines the bulk-wave generation and diffraction. The pressure and shear waves generated by the electrodes undergo multiple reflections and are picked up by the IDTs. A stress-free surface at the bottom gives absorption-free reflections, while most of the gyro bottom surface are solidly attached using adhesive bonding.

Figure 8A:
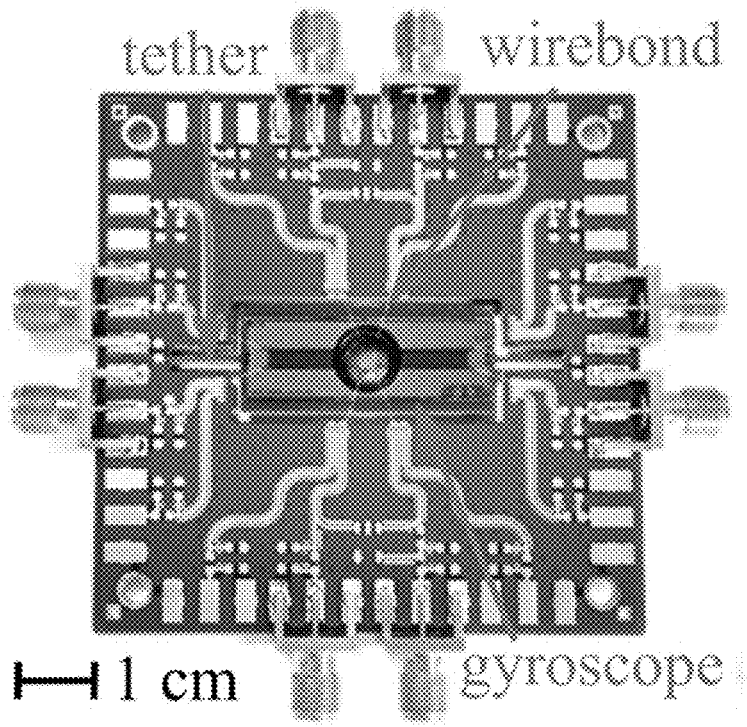
FIG. 8A is a bulk diffraction wave gyroscope system, in accordance with an embodiment.
Figure 8B:
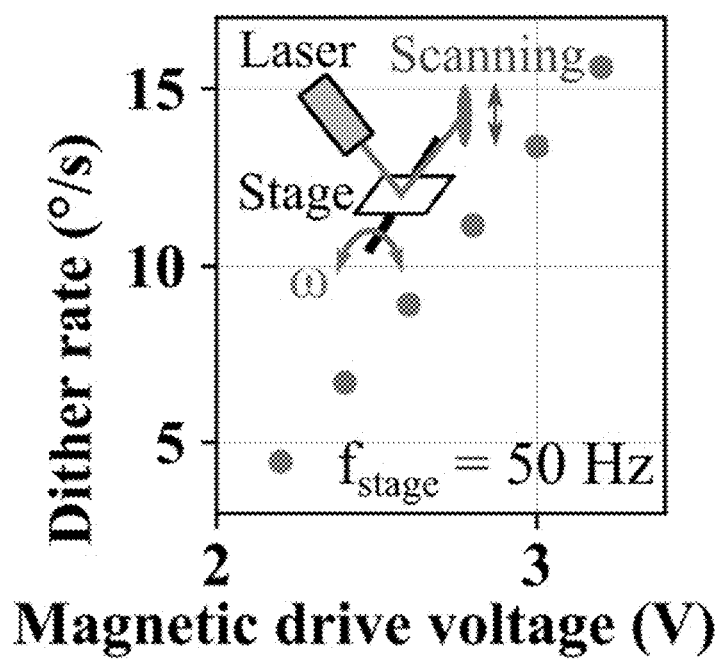
FIG. 8B is a graph of calibrated dither rate, with an inset demonstrating a stage calibrating setup diagram, in accordance with an embodiment.
Figure 9:
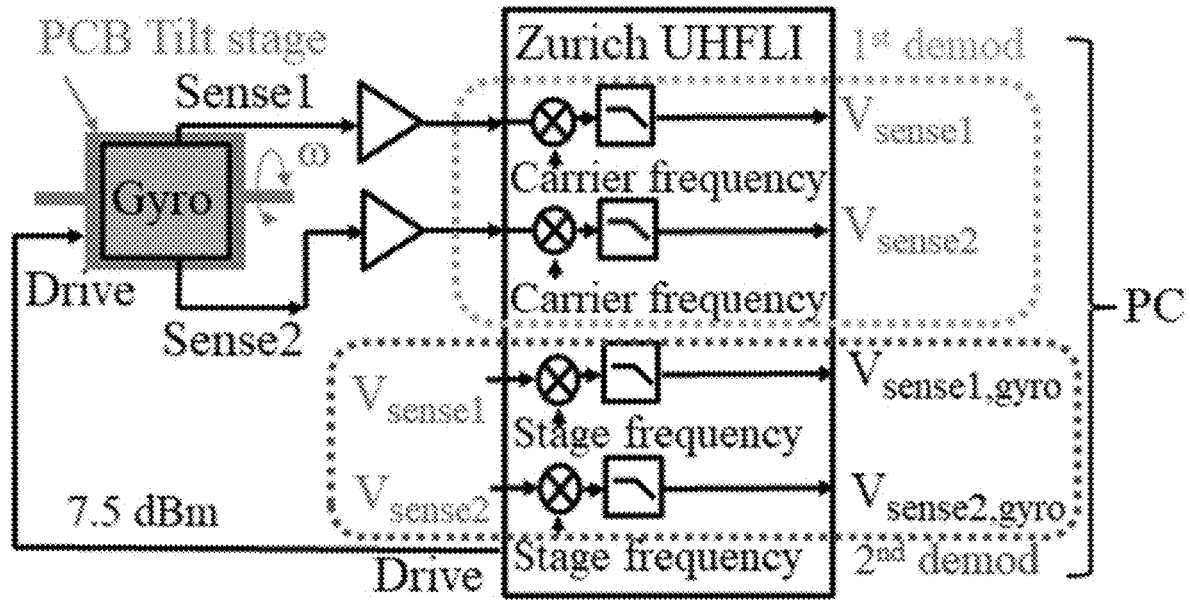
FIG. 9 is a schematic representation of a system using a bulk diffraction wave gyroscope system, in accordance with an embodiment.

A custom FR4-PCB magnetic actuated rate-applying stage is implemented for fast testing of the RF driven gyroscope (see FIG. 8A, which is a top view of the gyroscope on a PCB with integrated FR4 stage). The stage motion is optically calibrated by measuring reflected laser scanning length (see FIG. 8B, which shows calibrated dither rate, which the inset demonstrating the stage calibrating setup diagram). An example of the dither rate as a function of mechanical shaker drive voltage is shown in FIG. 8B. Gyroscope output was measured by driving and sensing using a Zurich UHFLI high frequency lock-in amplifier, as shown in FIG. 9.

Figure 10:
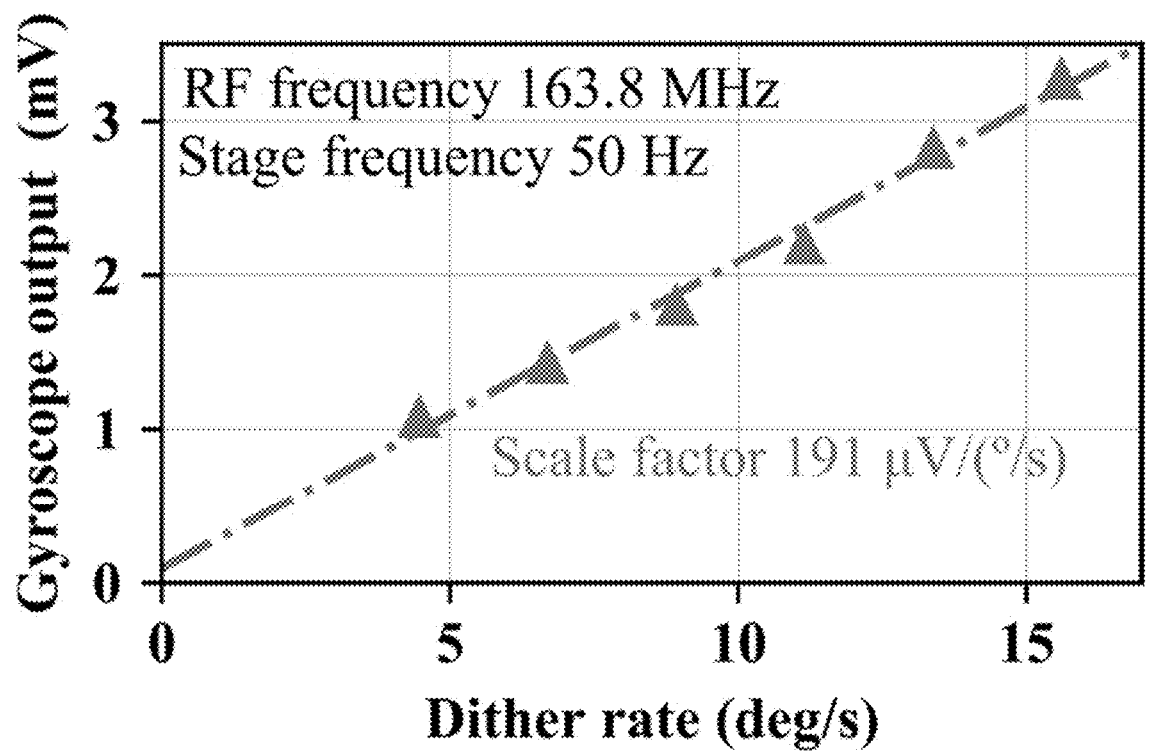
FIG. 10 is a schematic representation of a system using a bulk diffraction wave gyroscope system, in accordance with an embodiment.
Figure 11:
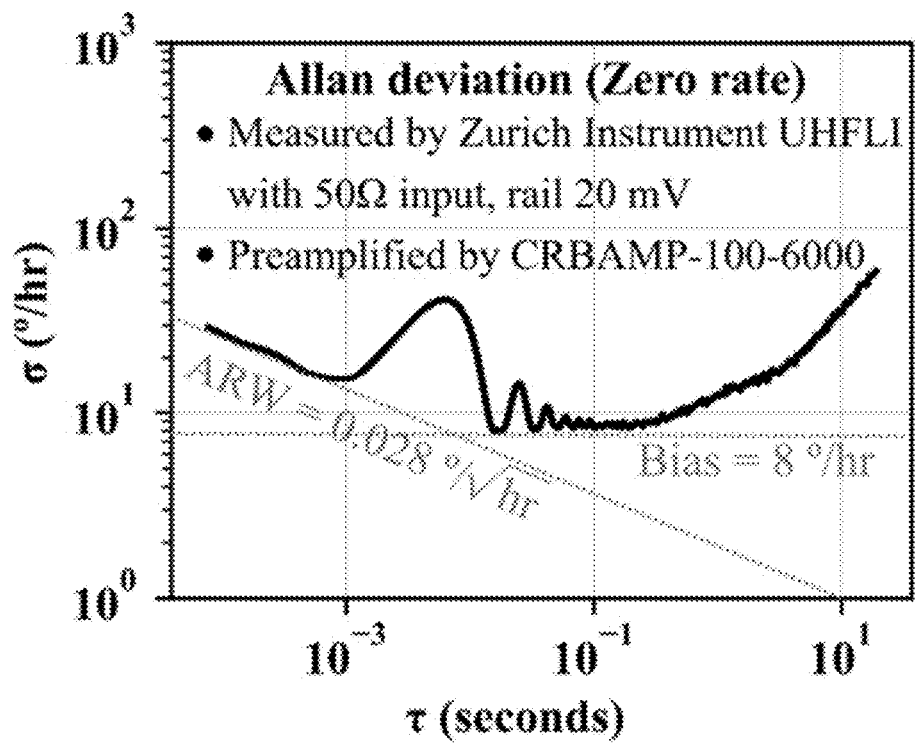
FIG. 11 is a graph showing Allan deviation of zero rate response, in accordance with an embodiment.
Figure 12:
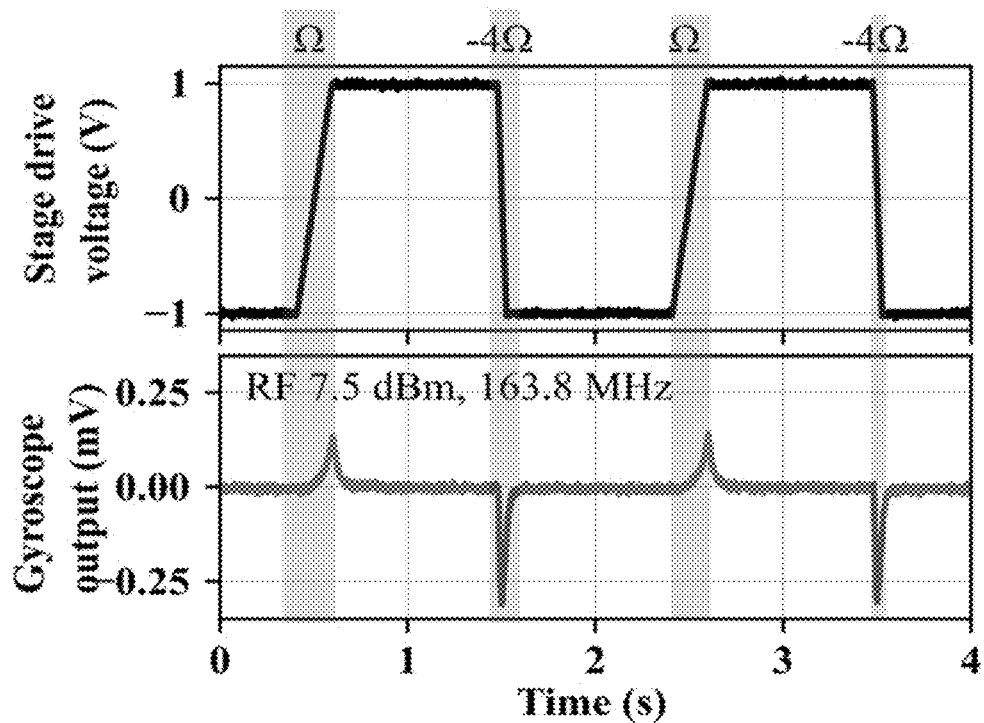
FIG. 12 is a graph showing gyroscope directional response displayed with asymmetric drive of the stage, in accordance with an embodiment.

Referring to FIG. 10, showing scale factor measurement of the bulk gyroscope on magnetic dither stage setup, the maximum gyroscopic sensitivity 191 µV/(deg/s) was measured at 163.8 MHz shear-wave overtone resonance. Angle random walk (ARW) of 0.028 deg/hr$^{1/2}$, and a bias instability of 8 deg/hr was measured from the Allan deviation with short time convergence due to high-frequency operation, as shown in FIG. 11 (showing the Allan deviation of zero rate response; note that the peaking occurs due to VCO noise that can be removed with stabilized VCO). The gyroscope directional response is displayed with asymmetric drive of the stage, as shown in FIG. 12 (where asymmetric drive measurement shows gyroscope response in both CW and CCW directions). The stage drive motion is ramped down 4 times faster than ramping up, and the gyroscope shows rate response 4 time, as expected.

Shear Wave Gyroscope Design

Wave propagation is a classical problem in physics for hundreds of years. Although simplified cases had been studied rigorously, bulk acoustic wave in rotating media are recently studied and experimentally confirmed. The effect was ignored initially because of the minute changes on the wave. The Sagnac effect—which describes phase changing of electromagnetic wave in a rotating frame—is caused by a fundamental postulate in the special relativity theory that speed of light is constant in all inertial frame. On the other hand, acoustic wave speed is relative to the media that the wave travels; therefore, an acoustic wave is not affected by the Sagnac effect. Nevertheless, acoustic wave in rotating media is affected by the Coriolis force in a nontrivial way. Many articles proposed theory for different aspects without experimental results. Nevertheless, these theories are not experimentally confirmed.

Described below are possible equations and elements that can be utilized to calculate the effect of the Coriolis force on a shear wave, and thus utilized to detect rotation by a rotation sensor such as the bulk diffraction wave gyroscope described or otherwise envisioned herein.

Tensor Notation

In this section, element of vector and tensor notion will be used to simplify the Cartesian component form of the gyroscope.

Governing Equations

Below, governing equations for deriving effects of rotation on shear wave are listed in the full form without assuming crystal symmetry and other approximations. The effects of rotation can be derived from the stress equations of motion in an inertial frame of reference as:

$$\nabla \cdot T + f = \rho \ddot{u} \quad \text{(Eq. 1)}$$

and in tensor notation as:

$$T_{ji,j} + f_i = \rho \ddot{u}_i \quad \text{(Eq. 2)}$$

where T and $T_{ji}=T_{ij}$ is the stress tensor, f and $f_i$ is the body force vector, $\rho$ is the mass density and u and $u_i$ is the mechanical displacement vector. From Newtonian mechanics, a rotating frame of reference can be mathematically treated as an inertial frame with a fictitious force acting on all body. In a rotating frame with a rotation vector $\Omega$, Newton second law F=ma can be written as:

$$F - m\dot{\Omega} \times r - 2m\Omega \times \dot{r} - m\Omega \times (\Omega \times r) = ma \quad \text{(Eq. 3)}$$

where F is the force vector, r is the position vector, a is the acceleration vector, $-m\dot{\Omega} \times r$ is the Euler's angular acceleration force, $-2m\Omega \times \dot{r}$ is the Coriolis force, and $-m\Omega \times (\Omega \times r)$ is the centrifugal force. Similarly, the stress equations of motion in a rotating frame of reference can be written with pseudo force as:

$$\nabla \cdot T + f - \rho \dot{\Omega} \times r - 2\rho \Omega \times \dot{r} - \rho \Omega \times (\Omega \times r) = \rho \ddot{u} \quad \text{(Eq. 4)}$$

and in tensor notation as:

$$T_{ji,j} + f_i - 2\rho e_{ijk} \dot{\Omega}_j u_k - 2\rho e_{ijk} \Omega_j \dot{u}_k - \rho(\Omega_i \Omega_j u_j - \Omega_j \Omega_j u_i) = \rho \ddot{u}_i \quad \text{(Eq. 5)}$$

Material stress and strain relation is required for solving this stress equations of motion. For piezoelectric material, there are several commonly used forms of the constitutive equations. In this example, the following piezoelectric constitutive equations can be used for the convenient:

$$\text{(a) } [S]=[s^E][T]+[d]^t[E], \text{ (b) } [D]=[d][T]+[\epsilon^T][E] \quad \text{(Eq. 6)}$$

where [S] is strain tensor, [T] is stress tensor, [E] is electric field vector, [D] is the electric displacement vector, $[s^E]$ is a compliance tensor measured under constant electric field, $[\epsilon^T]$ is a compliance tensor measured under constant stress, and $[d]^t$ is transposed piezoelectric coefficient tensor. To simplify, the brackets and superscripted E and T are omitted as:

$$\text{(a) } S=sT+d^tE, \text{ (b) } D=dT+\epsilon E \quad \text{(Eq. 7)}$$

and in tensor notation as:

$$\text{(a) } T_{ij}=c_{ijkl}S_{kl}-e_{kij}E_k, \text{ (b) } D_i=e_{ijk}S_{jk}+\epsilon_{ij}E_j \quad \text{(Eq. 8)}$$

$$\text{(a) } [S]=[s^E][T]+[d]^t[E], \text{ (b) } [D]=[d][T]+[\epsilon^T][E] \quad \text{(Eq. 9)}$$

where [S] is a strain tensor, [T] is a stress tensor, [E] is an electric field vector, [D] is an electrical displacement vector, $[s^E]$ is a compliance tensor measured under constant electric field, $[\epsilon^T]$ is an electrical permittivity matrix measured under constant stress, and $[d]^T$ is a transposed piezoelectric coefficient tensor. To simplify, the brackets and superscripted E and T are omitted as:

$$\text{(a) } S=sT+d^tE, \text{ (b) } D=dT+\epsilon E \quad \text{(Eq. 10)}$$

and in tensor notation as:

$$\text{(a) } S_{ij}=s_{ijkl}T_{kl}+d_{kij}E_k, \text{ (b) } D_i=d_{ijk}T_{jk}+\epsilon_{ij}E_j \quad \text{(Eq. 11)}$$

$$\text{(a) } S_{ij}=s_{ijkl}T_{kl}+d_{kij}E_k, \text{ (b) } D_i=d_{ijk}T_{jk}+\epsilon_{ij}E_j \quad \text{(Eq. 12)}$$

(a) $S_p = s_{pq}T_q + d_{kp}E_k$, (b) $D_i = d_{pk}T_{jk} + \epsilon_{ij}E_j$ (Eq. 13)

(a) $T_{ij} = c_{ijkl}S_{kl} - e_{kij}E_k$, (b) $D_i = e_{ijk}S_{jk} + \epsilon_{ij}E_j$ (Eq. 14)

(a) $T_p = c_{pq}S_q - e_{kp}E_k$, (b) $D_i = e_{iq}S_q + \epsilon_{ij}E_j$ (Eq. 15)

Equations 5 and 11 can be rigorously solved without approximations, but the solutions are complicated. In the next sections, two simplified cases are shown along with their first order solutions. First, the first order effect of rotation on travelling shear wave in an isotropic media is shown. Since traveling wave directions can be arbitrary, assuming isotropic media significantly simplifies the solution. Second, the first order effect of rotation on thickness shear wave resonator is shown. In this case, the shear wave is confined in a standing wave with known polarization directions. Considering only relevant equations for the standing wave greatly reduces complexity.

Traveling Shear Wave in Rotating Media

In this section, the first order effect of rotation on traveling shear wave is derived from the constitutive equations 5 and 11. Since traveling wave direction can be arbitrary, rotating material property matrices is easier than rotating the wave. Notably, only the first order effect is considered.

Figure 13:
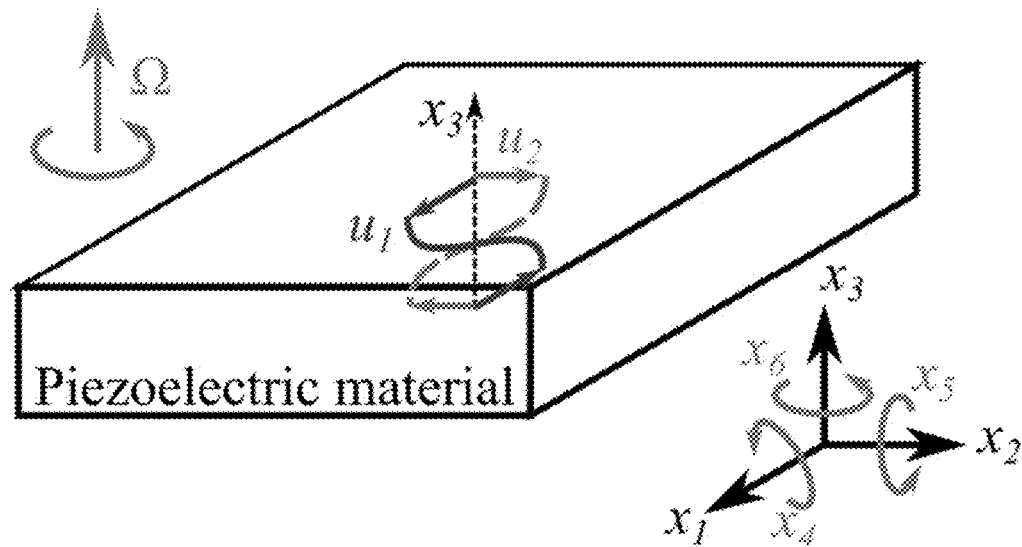
FIG. 13 is a schematic representation of a bulk diffraction wave gyroscope system, in accordance with an embodiment.

A plane shear wave travels in $x_3$ direction with $u_1$ and $u_2$ displacement field representing polarization in $x_1$ and $x_2$ as shown in FIG. 13 (showing a traveling shear wave). This shear wave is in a rotating media with rotation vector $\Omega$. This derivation can explain shear wave traveling in arbitrary directions by rotating material property matrices.

The displacement field can be described a general form of a plane wave in the tensor notation form as:

$$u_1 = A \exp(jkx_3)\exp(j\omega t) \quad \text{(Eq. 16)}$$

$$u_2 = B \exp(jkx_3)\exp(j\omega t) \quad \text{(Eq. 17)}$$

$$u_3 = 0 \quad \text{(Eq. 18)}$$

where $u_i$ is the displacement field in the $x_i$ direction, A and B are the wave amplitude, k is the wave number, $\omega$ is the angular frequency, t is time, and j is imaginary unit. From the stress equations of motion in equation 5, considering only constant rotation ($\dot\Omega = 0$), and no external force (f=0), the equations are reduced to:

$$T_{ji,j} - 2\rho e_{ijk}\Omega_j \dot u_k - \rho(\Omega_i\Omega_j u_j - \Omega_j\Omega_j u_i) = \rho \ddot u_i \quad \text{(Eq. 19)}$$

In gyroscope context, the external rotation rate of the media is much slower than the wave frequency ($\Omega \ll \omega$). In the first order approximation, the second order centrifugal terms can be neglected. Furthermore, since the displacement in the traveling direction $u_3$ is negligible as in equation 18, equations for i=3 can be ignored. After the approximation, the relevant equations are:

$$T_{31,3} + 2\rho\Omega_3 \dot u_2 = \rho \ddot u_1 \quad \text{(Eq. 20)}$$

$$T_{32,3} - 2\rho\Omega_3 \dot u_1 = \rho \ddot u_2 \quad \text{(Eq. 21)}$$

The index:

$$T_{5,3} + 2\rho\Omega_3 \dot u_2 = \rho \ddot u_1 \quad \text{(Eq. 22)}$$

$$T_{4,3} - 2\rho\Omega_3 \dot u_1 = \rho \ddot u_2 \quad \text{(Eq. 23)}$$

From the piezoelectric constitutive equations in equation 8, the relevant equations are:

$$T_5 = c_{55}S_5 - e_{25}E_2 \quad \text{(Eq. 24)}$$

$$T_4 = c_{44}S_4 - e_{14}E_1 \quad \text{(Eq. 25)}$$

From the definition of compressed notation $S_p = 2S_{ij}$ when $i \neq j$, p=4, 5, 6 and the definition of strain $S_{ij} = (u_{i,j} + u_{j,i})/2$, strain can be written in the displacement field as:

$$T_5 = c_{55}u_{1,3} - e_{25}E_2 \quad \text{(Eq. 26)}$$

$$T_4 = c_{44}u_{2,3} - e_{14}E_1 \quad \text{(Eq. 27)}$$

Substitute $T_5$ and $T_4$ from equations 26 and 27 into 22 and 23 and get:

$$c_{55}u_{1,33} + 2\rho\Omega_3 \dot u_2 = \rho \ddot u_1 \quad \text{(Eq. 28)}$$

$$c_{44}u_{2,33} - 2\rho\Omega_3 \dot u_1 = \rho \ddot u_2 \quad \text{(Eq. 29)}$$

This is a system of linear differential equations, which can be solved by substituting general answers of $u_1$ and $u_2$ from equations 16 and 17 and get:

$$-c_{55}k^2 A + 2\rho\Omega_3 Bj\omega = -\omega^2 \rho A \quad \text{(Eq. 30)}$$

$$-c_{44}k^2 B - 2\rho\Omega_3 Aj\omega = -\omega^2 \rho B \quad \text{(Eq. 31)}$$

This can be rearranged as:

$$\left(\frac{c_{55}}{\rho}\frac{k^2}{\omega^2} - 1\right)A - 2j\frac{\Omega_3}{\omega}B = 0 \quad \text{(Eq. 32)}$$

$$2j\frac{\Omega_3}{\omega}A + \left(\frac{c_{44}}{\rho}\frac{k^2}{\omega^2} - 1\right)B = 0 \quad \text{(Eq. 33)}$$

which is in the matrix from as:

$$\begin{bmatrix} \left(\frac{c_{55}}{\rho}\frac{k^2}{\omega^2} - 1\right) & -2j\frac{\Omega_3}{\omega} \\ 2j\frac{\Omega_3}{\omega} & \left(\frac{c_{44}}{\rho}\frac{k^2}{\omega^2} - 1\right) \end{bmatrix} \begin{bmatrix} A \\ B \end{bmatrix} = 0 \quad \text{(Eq. 34)}$$

Since A and B are independent variables, the differential equations will be satisfied for every A and B only when the determinant is zero. This gives a dispersion equation as:

$$\left(\frac{c_{44}}{\rho}\frac{k^2}{\omega^2} - 1\right)\left(\frac{c_{55}}{\rho}\frac{k^2}{\omega^2} - 1\right) - \left(\frac{2\Omega_3}{\omega}\right)^2 = 0 \quad \text{(Eq. 35)}$$

This equation can be solved by gathering $k^2/(\rho\omega^2)$ terms in a quadratic equation as:

$$c_{44}c_{55}\left(\frac{k^2}{\rho\omega^2}\right)^2 - (c_{44} + c_{55})\left(\frac{k^2}{\rho\omega^2}\right) + 1 - \left(\frac{2\Omega_3}{\omega}\right)^2 = 0 \quad \text{(Eq. 36)}$$

The two solutions of the quadratic equation are:

$$\frac{k^2}{\rho\omega^2} = \frac{(c_{44} + c_{55}) \pm \sqrt{(c_{44} + c_{55})^2 - 4c_{44}c_{55} + 4c_{44}c_{55}\left(\frac{2\Omega_3}{\omega}\right)^2}}{2c_{44}c_{55}} \quad \text{(Eq. 37)}$$

These two solutions represent shear waves travel at different speeds. The wavenumber k can be solved as:

$$k = \pm\sqrt{\rho\omega^2 \frac{(c_{44}+c_{55}) \pm \sqrt{(c_{44}+c_{55})^2 - 4c_{44}c_{55} + 4c_{44}c_{55}\left(\frac{2\Omega_3}{\omega}\right)^2}}{2c_{44}c_{55}}} \quad \text{(Eq. 38)}$$

The positive and negative value of k indicates wave traveling direction. From equation 34, substitute B by $\alpha A$ to get the coefficient of each modes. The full solution of the wave is:

$$u_1 = \Sigma_{m=1}^4 A_m \exp(jk_m x_3)\exp(j\omega t) \quad \text{(Eq. 39)}$$

$$u_2 = \Sigma_{m=1}^4 A_m \alpha_m \exp(jk_m x_3)\exp(j\omega t) \quad \text{(Eq. 40)}$$

$$\alpha_m = -j\frac{\omega}{2\Omega_3}\left(\frac{c_{55}}{\rho}\frac{k_m^2}{\omega^2} - 1\right) \quad \text{(Eq. 41)}$$

$$k_1 = +\sqrt{\rho\omega^2 \frac{(c_{44}+c_{55}) + \sqrt{(c_{44}+c_{55})^2 - 4c_{44}c_{55} + 4c_{44}c_{55}\left(\frac{2\Omega_3}{\omega}\right)^2}}{2c_{44}c_{55}}} \quad \text{(Eq. 42)}$$

$$k_2 = +\sqrt{\rho\omega^2 \frac{(c_{44}+c_{55}) - \sqrt{(c_{44}+c_{55})^2 - 4c_{44}c_{55} + 4c_{44}c_{55}\left(\frac{2\Omega_3}{\omega}\right)^2}}{2c_{44}c_{55}}} \quad \text{(Eq. 43)}$$

$$k_3 = -\sqrt{\rho\omega^2 \frac{(c_{44}+c_{55}) + \sqrt{(c_{44}+c_{55})^2 - 4c_{44}c_{55} + 4c_{44}c_{55}\left(\frac{2\Omega_3}{\omega}\right)^2}}{2c_{44}c_{55}}} \quad \text{(Eq. 44)}$$

$$k_4 = -\sqrt{\rho\omega^2 \frac{(c_{44}+c_{55}) - \sqrt{(c_{44}+c_{55})^2 - 4c_{44}c_{55} + 4c_{44}c_{55}\left(\frac{2\Omega_3}{\omega}\right)^2}}{2c_{44}c_{55}}} \quad \text{(Eq. 45)}$$

Many piezoelectric materials such as PZT ceramics and sputtered AlN thin films have in-plane symmetry: $c_{44}=c_{55}$. In this case, the wave number (k) can be simplified and approximated as:

$$\alpha_1 = -j; \quad k_1 \approx \sqrt{\frac{\rho}{c_{55}}}\omega\left(1 + \frac{\Omega_3}{\omega}\right) \quad \text{(Eq. 46)}$$

$$\alpha_2 = +j; \quad k_2 \approx \sqrt{\frac{\rho}{c_{55}}}\omega\left(1 - \frac{\Omega_3}{\omega}\right) \quad \text{(Eq. 47)}$$

$$\alpha_3 = -j; \quad k_3 \approx -\sqrt{\frac{\rho}{c_{55}}}\omega\left(1 + \frac{\Omega_3}{\omega}\right) \quad \text{(Eq. 48)}$$

$$\alpha_4 = +j; \quad k_4 \approx -\sqrt{\frac{\rho}{c_{55}}}\omega\left(1 - \frac{\Omega_3}{\omega}\right) \quad \text{(Eq. 49)}$$

To interpret the results, the general solution can be written as a linear combination of a plane wave in a vector form:

$$u(x_3, t) = \frac{A}{2}(e_1 - ie_2)\exp\left(\pm jk_0\left(1 + \frac{\Omega_3}{\omega}\right)x_3 + j\omega t\right) + \frac{A}{2}(e_1 + ie_2)\exp\left(\pm jk_0\left(1 - \frac{\Omega_3}{\omega}\right)x_3 + j\omega t\right) \quad \text{(Eq. 50)}$$

where $e_i$ is a unit vector i direction, $k_0 = \sqrt{\rho/c_{55}}\omega$ is the wave number without rotation, and A is the wave amplitude. This equation can be written as a wave with circular polarization as:

$$u(x_3,t) = A\hat{q}(x_3)\exp(\pm jk_0 x_3 + j\omega t) \quad \text{(Eq. 51)}$$

where $\hat{q}(x_3)$ is the circular polarization unit vector in the form:

$$\hat{q}(x_3) = e_1 \cos\left(\pm k_0 \frac{\Omega_3}{\omega}x_3\right) + e_2 \sin\left(\pm k_0 \frac{\Omega_3}{\omega}x_3\right) \quad \text{(Eq. 52)}$$

Consider $\theta$ as a polarization angle measured from $e_1$ in $e_1$ and $e_2$ plane, polarization angle is:

$$\theta(x_3) = \pm k_0 \frac{\Omega_3}{\omega}x_3 \quad \text{(Eq. 53)}$$

At rotation rate $\Omega_3 \ll \omega$, wave speed is a $+\omega/k_0$, so the polarization as a function of time is:

$$\theta(t) = -\Omega_3 t \quad \text{(Eq. 54)}$$

Equation 54 indicates that polarization of the shear wave rotates with the rate $\theta_{dot} = -\Omega_3$ which depends on only external rotation rate and travel time. The polarization angle is independent of wave direction, and wave frequency.

Thickness Shear Resonator in Rotating Media

In this section, the first order effect of rotation on thickness shear wave resonator is derived from the constitutive equations 5 and 11. Notably only the first order effect is considered.

A thickness shear resonator with thickness t in $x_3$ direction and infinite size in $x_1$ and $x_2$ directions is shown in FIG. 13. The resonator is rotating with a rotation rate $\Omega_3$ in the $x_3$ directions. The shear wave resonator is driven with the displacement field $u_1$ in $x_1$ direction. Standing wave can be modeled as a superposition of traveling wave, so the solutions have a general form similar to equations 16, 17, and 18 as:

$$u_1 = A_n \exp(jk_n x_3)\exp(j\omega t) \quad \text{(Eq. 55)}$$

$$u_2 = A_n \alpha_n \exp(jk_n x_3)\exp(j\omega t) \quad \text{(Eq. 56)}$$

$$u_3 = 0 \quad \text{(Eq. 57)}$$

where $A_n$ and $A_n\alpha_n$ is the amplitude of the shear wave with polarization in $x_1$ and $x_2$ directions, $k_n$ is the wave number, $\omega$ is a angular frequency. The governing equations are similar to the traveling wave in equation 28, then equation 29 as:

$$c_{55}u_{1,33} + 2\rho\Omega_3\dot{u}_2 = \rho\ddot{u}_1 \quad \text{(Eq. 58)}$$

$$c_{44}u_{2,33} - 2\rho\Omega_3\dot{u}_1 = \rho\ddot{u}_2 \quad \text{(Eq. 59)}$$

where $\rho$ is the material density, $c_{55}$ and $c_{44}$ are stiffness coefficients, and Ana, is the sensing wave amplitude. Since the shear wave resonator is driven in $x_1$ direction, the sensing displacement amplitude $u_2$ are small compared $u_1$. The resonator generally has resonance frequency more than 1 MHz, which is much higher than the rotation rate $\Omega_3$.

As a result, the expression $2\rho\Omega_3\dot{u}_2$ in equation 58 is a negligible second order effect. The governing equation for the driving direction is approximately independent to $\Omega_3$ and $u_2$ as:

$$c_{55}u_{1,33} = \rho\ddot{u}_1 \quad \text{(Eq. 60)}$$

This is a second order linear differential equation, which can be solved by substituting general answers of $u_1$ from equation 55 and get:

$$-c_{55}k_n^2 A = -\omega^2 \rho A_n \quad \text{(Eq. 61)}$$

This equation can be simplified to get the dispersion equation for a thickness shear wave resonator as:

$$k_n^2 = \omega^2 \rho / c_{55} \quad \text{(Eq. 62)}$$

To find $u_2$, an elastic damping can be added to equation 59 as $c_{44}$ becomes $c_{44}(1+j/Q_s)[\ ]$:

$$c_{44}(1+j/Q_s)u_{2,33} - 2\rho\Omega_3\dot{u}_1 = \rho\ddot{u}_2 \quad \text{(Eq. 63)}$$

where $Q_s$ is the quality factor of the sense mode. Substitute general answers of $u_1$ and $u_2$ from equations 55 and 56 and get:

$$-c_{44}\left(1+\frac{j}{Q_s}\right)k_n^2 A_n \alpha_n - 2\rho\Omega_3 A_n j\omega = -\omega^2 \rho A_n \alpha_n \quad \text{(Eq. 64)}$$

This equation can be rearranged and solve for the transfer function to sense mode $\alpha_n = u_2/u_1$ as:

$$\alpha_n = \frac{-2\rho\Omega_3 j\omega}{\left(c_{44}k_n^2\left(1+\frac{j}{Q_s}\right) - \omega^2\rho\right)} \quad \text{(Eq. 65)}$$

Substitute $k_n^2$ from equation 62, and get the sense mode standing wave from equations 55 and 56 as:

$$u_2 = -2j\frac{\Omega_3}{\omega}\frac{1}{\left(\frac{c_{44}}{c_{55}} + \frac{c_{44}j}{c_{55}Q_s} - 1\right)}u_1 \quad \text{(Eq. 66)}$$

Equation 66 describes a sensing shear wave $u_2$ generated by coupling from driven shear wave $u_1$ due to Coriolis force. The amplitude of the shear wave $u_2$ is linearly proportional to the external rotation rate $\Omega_3$. This shear wave resonator can be used as a gyroscope by measuring $u_2$ from electric potential or current output generated by piezoelectric transduction. For materials with in-plane symmetry ($c_{44}=c_{55}$), the driving and sensing resonance modes have the same frequency. Equation 66 can be simplified to:

$$\text{Mode match}(c_{44} = c_{55}); \quad u_2 = -2\frac{\Omega_3}{\omega}Q_s u_1 \quad \text{(Eq. 67)}$$

Most commercial gyroscopes intentionally have different resonance frequency for driving and sensing modes because of fabrication process variation [ ]. If the stiffness coefficient $c_{44} \gg c_{55}$, this thickness-shear wave gyroscope behaves similar to mode split gyroscope as:

$$\text{Mode split}(c_{44} \gg c_{55}); \quad u_2 \approx -2j\frac{\Omega_3}{\omega}\frac{c_{55}}{c_{44}}u_1 \quad \text{(Eq. 68)}$$

The design and analysis of thickness-shear wave gyroscope can be as described or otherwise envisioned herein.

Device Optimization

To optimize the gyroscope scale factor, the angle of incidence is chosen to maximize the mode conversion to SV wave. Approximate that the incidence should be optimized to the angle of incident:

$$\frac{v_p}{v_s} = \frac{\sin(\theta_p)}{\sin(\theta_s)} \quad \text{(Eq. 69)}$$

Figure 14:
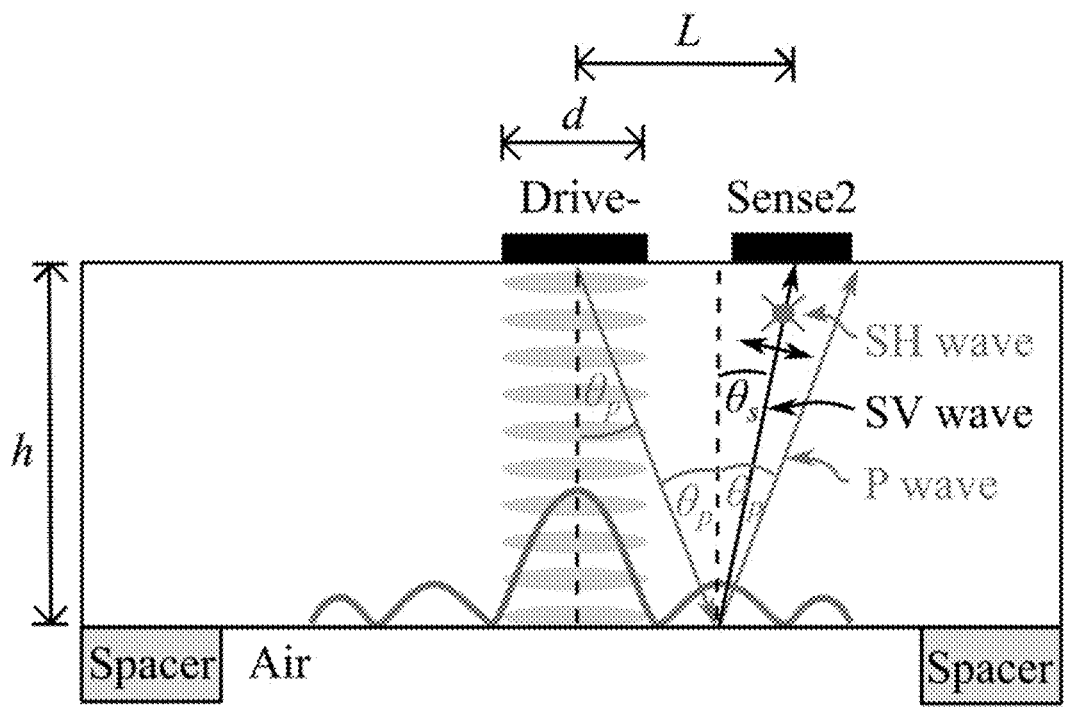
FIG. 14 is a schematic representation of a bulk diffraction wave gyroscope system, in accordance with an embodiment.
Figure 15:
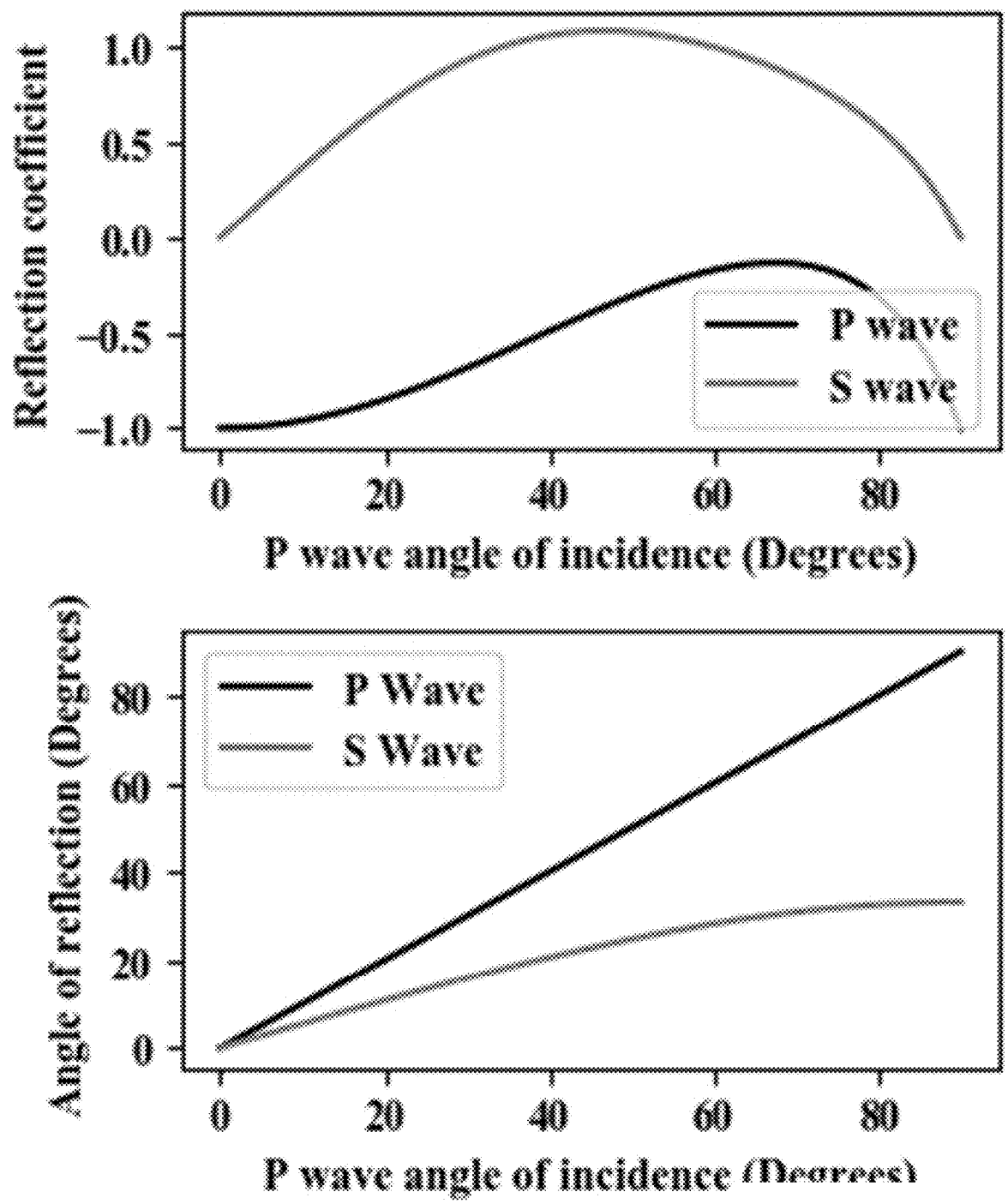
FIG. 15 is a graph of P wave angle of incidence, in accordance with an embodiment.
Figure 16:
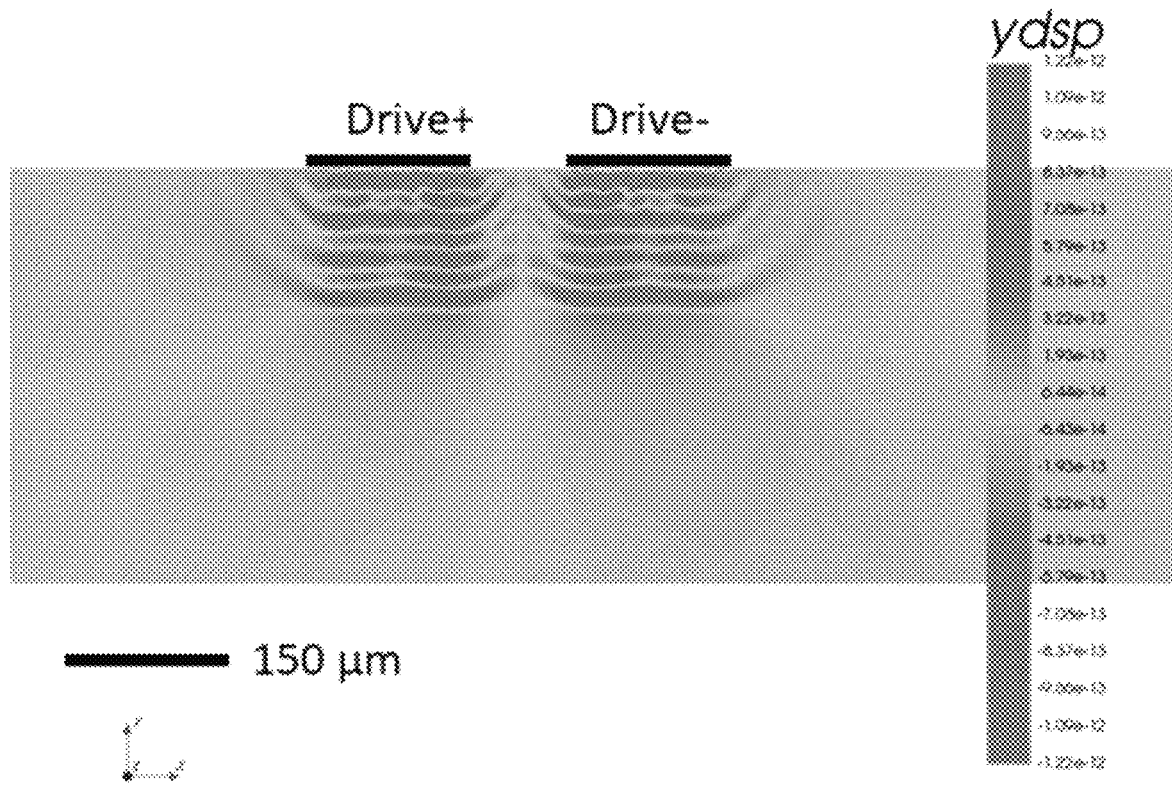
FIG. 16 is a graph of simulation of P wave generation by drive electrodes, in accordance with an embodiment.

Referring to FIG. 14, in one embodiment, is a cross-section of the bulk diffraction gyroscope illustrating the angle of incidence and the angle of reflection. Referring to FIG. 15 are graphs of the P wave angle of incidence. Referring to FIG. 16 is a simulation of P wave generation by drive electrodes.

$$\Gamma_{pp} = \frac{\sin 2\theta_s \sin 2\theta_p - (v_p/v_s)^2 \cos^2 2\theta_s}{\sin 2\theta_s \sin 2\theta_p + (v_p/v_s)^2 \cos^2 2\theta_s} \quad \text{(Eq. 70)}$$

$$\Gamma_{sp} = \frac{2(v_p/v_s)\sin 2\theta_p \cos 2\theta_s}{\sin 2\theta_s \sin 2\theta_p + (v_p/v_s)^2 \cos^2 2\theta_s} \quad \text{(Eq. 71)}$$

$$T_{33,3} = \rho \ddot{u}_3 \quad \text{(Eq. 72)}$$

$$(a)\ T_{ij} = c_{ijkl}S_{kl} - e_{kij}E_k, \quad (b)\ D_i = e_{ijk}S_{jk} + \epsilon_{ij}E_j \quad \text{(Eq. 73)}$$

$$(a)\ T_p = c_{pq}S_q - e_{kp}E_k, \quad (b)\ D_i = e_{iq}S_q + \epsilon_{ij}E_j \quad \text{(Eq. 74)}$$

$$(a)\ T_3 = c_{33}S_3 - e_{13}E_1, \quad (b)\ D_1 = e_{13}S_3 + \epsilon_{11}E_1 \quad \text{(Eq. 75)}$$

$$T_3 = c_{33}S_3 - e_{13}E_1 \quad \text{(Eq. 76)}$$

$$D_1 = e_{13}S_3 + \epsilon_{11}E_1 \quad \text{(Eq. 77)}$$

$$\frac{C_0 V}{A} = e_{13}S_3 + \epsilon_{11}\frac{V}{l} \quad \text{(Eq. 78)}$$

$$\frac{C_0 V}{A} = e_{13}S_3 + \epsilon_{11}\frac{V}{l} \quad \text{(Eq. 79)}$$

$$T_3 = c_{33}S_3 - e_{13}E_1 \quad \text{(Eq. 80)}$$

$$T_3 = c_{33}u_{3,3} - e_{13}E_1 \quad \text{(Eq. 81)}$$

$$T_{3,3} = \rho\ddot{u}_3 \quad \text{(Eq. 82)}$$

$$\left(\frac{C_0}{A} - \epsilon_1 \frac{1}{l}\right) V = e_{13} u_{3,3} + \quad \text{(Eq. 83)}$$

Consider the drive electrode as an aperture, a diffraction pattern can be obtained by Fraunhofer approximation. The shape of the diffraction equation:

$$D(\theta) = \mathrm{sinc}\left(\frac{d\sin(\theta)}{\lambda_p}\right) \quad \text{(Eq. 84)}$$

The first constructive diffraction locates at:

$$D(\theta) = \mathrm{sinc}\left(\frac{d\sin(\theta)}{\lambda_p}\right) \quad \text{(Eq. 85)}$$

$$\Gamma_{pp} = \frac{\sin 2\theta_s \sin 2\theta_p - (v_p/v_s)^2 \cos^2 2\theta_s}{\sin 2\theta_s \sin 2\theta_p + (v_p/v_s)^2 \cos^2 2\theta_s} \quad \text{(Eq. 86)}$$

Although the present invention has been described in connection with a preferred embodiment, it should be understood that modifications, alterations, and additions can be made to the invention without departing from the scope of the invention as defined by the claims.

What is claimed is:

1. A rotation sensor, comprising:
   a substrate having a top surface and an interior bottom surface;
   an electrode module positioned on the top surface of the substrate and comprising:
   a first set of electrodes configured to generate a bulk acoustic wave directly into the substrate, wherein at least a portion of the bulk acoustic wave is transduced into a shear wave upon reflection on the interior bottom surface of the substrate without use of a reflector;
   a second set of electrodes configured to detect the shear wave; and
   a controller in communication with the first set and second set of electrodes and configured to determine, based on the detected shear wave, an effect of Coriolis force on the sensor.

2. The rotation sensor of claim 1, wherein the substrate is lithium niobate (LiNbO$_3$).

3. The rotation sensor of claim 1, wherein the first set of electrodes are interdigitated.

4. The rotation sensor of claim 1, wherein the second set of electrodes are interdigitated.

5. The rotation sensor of claim 1, wherein the first set of electrodes are centrally positioned on the substrate.

6. The rotation sensor of claim 1, wherein a quality factor of the rotation sensor is at least Q=30,000 at 2 GHz.

7. The rotation sensor of claim 1, wherein a quality factor of the rotation sensor is at least Q=55,000 at 2 GHz.

8. The rotation sensor of claim 1, wherein the first electrode set and/or second electrode set comprises gold and/or titanium.

9. The rotation sensor of claim 1, wherein the rotation sensor is configured such that a thickness resonance of the bulk acoustic wave is maintained by a stress-free surface at a bottom of the first set of electrodes, and the bulk acoustic wave is therefore trapped under the first set of electrodes.

10. The rotation sensor of claim 1, wherein the second set of electrodes is perpendicular to the first set of electrodes.

11. A method for detecting rotation, comprising the steps of:
    providing a rotation sensor comprising: (i) a substrate having a top surface and an interior bottom surface; and (ii) an electrode module positioned on the top surface of the substrate and comprising a first set of electrodes and a second set of electrodes;
    generating, by the first set of electrodes, a bulk acoustic wave directly into the substrate, wherein at least a portion of the bulk acoustic wave is transduced into a shear wave upon reflection on the interior bottom surface of the substrate without use of a reflector;
    detecting, by the second set of electrodes, the shear wave; and
    determining, based on the detected shear wave, an effect of Coriolis force on the sensor.

12. The method of claim 11, wherein the substrate is lithium niobate (LiNbO$_3$).

13. The method of claim 11, wherein the first set of electrodes are interdigitated.

14. The method of claim 11, wherein the second set of electrodes are interdigitated.

15. The method of claim 11, wherein the first set of electrodes are centrally positioned on the substrate.

16. The method of claim 11, wherein a quality factor of the rotation sensor is at least Q=30,000.

17. The method of claim 11, wherein a quality factor of the rotation sensor is at least Q=55,000.

18. The method of claim 11, wherein the first electrode set and/or second electrode set comprises gold and/or titanium.

19. The method of claim 11, wherein the rotation sensor is configured such that a thickness resonance of the bulk acoustic wave is maintained by a stress-free surface at a bottom of the first set of electrodes, and the bulk acoustic wave is therefore trapped under the first set of electrodes.

20. The method of claim 10, wherein the second set of electrodes is perpendicular to the first set of electrodes.

* * * * *